US007286406B2

(12) United States Patent
Lutze et al.

(10) Patent No.: US 7,286,406 B2
(45) Date of Patent: Oct. 23, 2007

(54) METHOD FOR CONTROLLED PROGRAMMING OF NON-VOLATILE MEMORY EXHIBITING BIT LINE COUPLING

(75) Inventors: Jeffrey W. Lutze, San Jose, CA (US); Yan Li, Milpitas, CA (US); Siu L. Chan, San Jose, CA (US)

(73) Assignee: Sandisk Corporation, Milpitas, CA (US)

( * ) Notice: Subject to any disclaimer, the term of this patent is extended or adjusted under 35 U.S.C. 154(b) by 14 days.

(21) Appl. No.: 11/250,735

(22) Filed: Oct. 14, 2005

(65) Prior Publication Data
US 2007/0086247 A1  Apr. 19, 2007

(51) Int. Cl.
G11C 16/04 (2006.01)
(52) U.S. Cl. .................. 365/185.18; 365/185.17; 365/185.23
(58) Field of Classification Search ........... 365/185.18, 365/185.24, 185.17, 185.03, 185.23, 185.12
See application file for complete search history.

(56) References Cited

U.S. PATENT DOCUMENTS

| 4,357,685 A | 11/1982 | Daniele et al. |
| 5,053,990 A | 10/1991 | Kreifels et al. |
| 5,220,531 A | 6/1993 | Blyth et al. |
| 5,313,421 A | 5/1994 | Guterman et al. |
| 5,412,601 A | 5/1995 | Sawada et al. |
| 5,511,022 A | 4/1996 | Yim et al. |
| 5,521,865 A | 5/1996 | Ohuchi et al. |
| 5,570,315 A | 10/1996 | Tanaka et al. |
| 5,652,719 A | 7/1997 | Tanaka et al. |
| 5,712,180 A | 1/1998 | Guterman et al. |
| 5,712,815 A | 1/1998 | Bill et al. |
| 5,761,222 A | 6/1998 | Baldi |
| 5,835,421 A | 11/1998 | Pham et al. |
| 5,870,344 A | 2/1999 | Ozawa |

(Continued)

FOREIGN PATENT DOCUMENTS

EP    1 154 439 A1    11/2001

OTHER PUBLICATIONS

Kurata, Hideaki, et al., Constant-Charge-Injection Programming for 10-MB/s Multilevel AG-AND Flash Memories, 2002 Symposium On VLSI Circuits Digest of Technical Papers, pp. 302-303.

(Continued)

*Primary Examiner*—Richard T. Elms
*Assistant Examiner*—Hien N Nguyen
(74) *Attorney, Agent, or Firm*—Vierra Magen Marcus & DeNiro LLP

(57) ABSTRACT

The effects of bit line-to-bit line coupling in a non-volatile memory are addressed. An inhibit voltage is applied on a bit line of a storage element to be programmed to inhibit programming during a portion of a program voltage. The inhibit voltage is subsequently removed during the program voltage to allow programming to occur. Due to the proximity of bit lines, the change in the bit line voltage is coupled to a neighboring unselected bit line, reducing the neighboring bit line voltage to a level which might be sufficient to open a select gate and discharge a boost voltage. To prevent this, the select gate voltage is temporarily adjusted during the change in the bit line voltage to ensure that the biasing of the select gate on the unselected bit line is not sufficient to open the select gate.

28 Claims, 12 Drawing Sheets

U.S. PATENT DOCUMENTS

| | | | |
|---|---|---|---|
| 5,909,393 | A | 6/1999 | Tran et al. |
| 5,949,714 | A | 9/1999 | Hemink et al. |
| 5,991,202 | A | 11/1999 | Derhacobian et al. |
| 6,049,494 | A | 4/2000 | Sakui |
| 6,151,248 | A | 11/2000 | Harari et al. |
| 6,160,730 | A | 12/2000 | Tooher |
| 6,222,762 | B1 | 4/2001 | Guterman et al. |
| 6,243,290 | B1 | 6/2001 | Kurata et al. |
| 6,259,624 | B1 | 7/2001 | Nobukata |
| 6,266,270 | B1 | 7/2001 | Nobukata |
| 6,282,117 | B1 | 8/2001 | Tanaka et al. |
| 6,301,161 | B1 | 10/2001 | Holzmann et al. |
| 6,307,785 | B1 | 10/2001 | Takeuchi et al. |
| 6,317,364 | B1 | 11/2001 | Guterman et al. |
| 6,363,010 | B2 | 3/2002 | Tanaka et al. |
| 6,424,566 | B1 | 7/2002 | Parker |
| 6,469,933 | B2 | 10/2002 | Choi et al. |
| 6,522,580 | B2 | 2/2003 | Chen et al. |
| 6,525,964 | B2 | 2/2003 | Tanaka et al. |
| 6,529,412 | B1 | 3/2003 | Chen et al. |
| 6,532,172 | B2 | 3/2003 | Harari et al. |
| 6,577,533 | B2 | 6/2003 | Sakui |
| 6,714,457 | B1 * | 3/2004 | Hsu et al. ............... 365/185.28 |
| 6,801,457 | B2 * | 10/2004 | Tanzawa et al. ....... 365/185.22 |
| 6,859,397 | B2 | 2/2005 | Lutze et al. |
| 6,885,583 | B2 | 4/2005 | Tanaka |
| 6,937,520 | B2 * | 8/2005 | Ono et al. ............. 365/185.18 |
| 6,974,979 | B2 | 12/2005 | Watanabe |
| 6,977,842 | B2 | 12/2005 | Nazarian |
| 7,023,730 | B2 * | 4/2006 | Kouno ................. 365/185.12 |
| 7,126,854 | B2 * | 10/2006 | Park ..................... 365/185.18 |
| 7,206,235 | B1 | 4/2007 | Lutze |
| 2002/0003722 | A1 | 1/2002 | Kanda et al. |
| 2002/0071312 | A1 | 6/2002 | Tanaka et al. |
| 2002/0118574 | A1 | 8/2002 | Gongwer et al. |
| 2002/0138815 | A1 | 9/2002 | Chen et al. |
| 2003/0048662 | A1 | 3/2003 | Park et al. |
| 2003/0147278 | A1 | 8/2003 | Tanaka et al. |
| 2004/0032763 | A1 | 2/2004 | Chung |
| 2004/0032788 | A1 | 2/2004 | Sakui et al. |
| 2005/0057965 | A1 | 3/2005 | Cernea et al. |
| 2005/0057967 | A1 | 3/2005 | Khalid et al. |
| 2005/0083735 | A1 | 4/2005 | Chen et al. |

OTHER PUBLICATIONS

Johnson, William S., et al., SESSION XII: ROMs, PROMs and EROMs, 1980 IEEE International Solid State Circuits Conference, pp. 152-153.

Nobukata, Hiromi, et al., A 144Mb 8-Level NAND Flash Memory with Optimized Pulse Width Programming, 1999 Symposium on VLSI Circuits Digest of Technical Papers, pp. 39-40.

Ohkawa, Masayoshi, et al., TP 2.3: A 98 mm2 3.3V 64Mb Flash Memory with FN-NOR Type 4-level Cell, 1996 IEEE International Solid-State Circuits Conference, pp. 36-37.

Takeuchi, et al., A Source-line Programming Scheme for Low Voltage Operation NAND Flash Memories, 1999 Symposium on VLSI Circuits Digest of Technical Papers, pp. 37-38.

U.S. Appl. No. 10/839,764, filed May 5, 2004, Guterman, et al.

U.S. Appl. No. 10/839,806, filed May 5, 2004, Guterman, et al.

Search report for PCT/US2006/039636 dated Feb. 27, 2007.

Notice of Allowance for U.S. Appl. No. 11/251,458, filed Oct. 14, 2005, titled "Apparatus for Controlled Programming of Non-Volatile Memory Exhibiting Bit Line Coupling,".

* cited by examiner

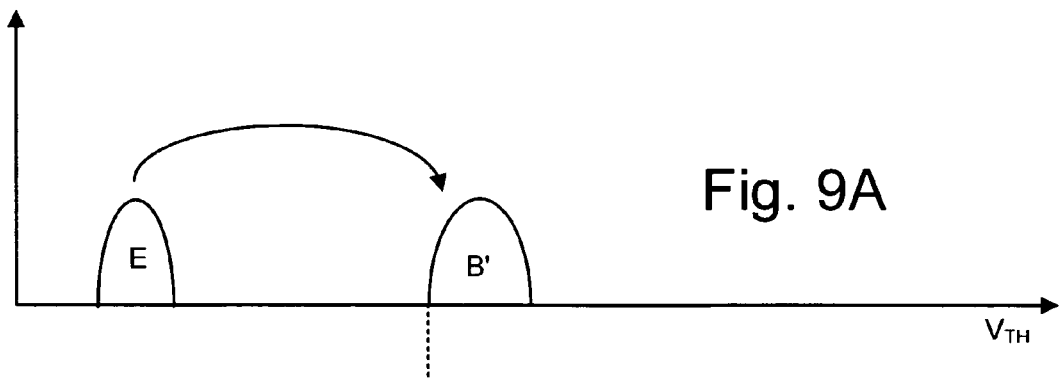
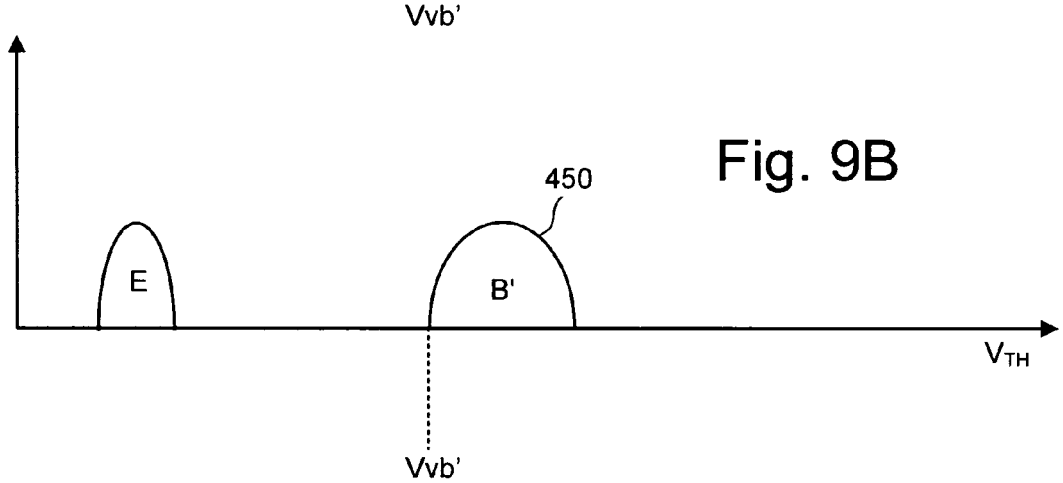
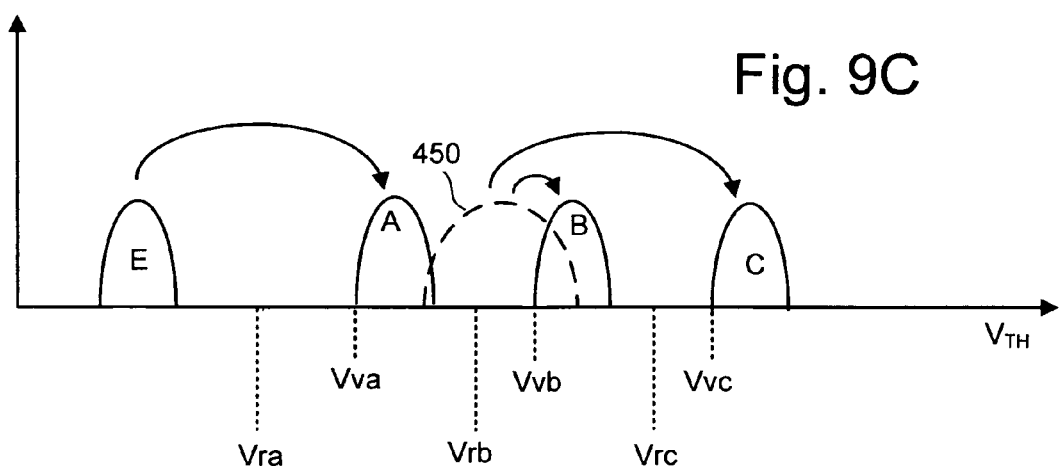

METHOD FOR CONTROLLED PROGRAMMING OF NON-VOLATILE MEMORY EXHIBITING BIT LINE COUPLING

BACKGROUND OF THE INVENTION

1. Field of the Invention

The present invention relates to programming non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{pgm}$ applied to the control gate during a program operation is applied as a series of pulses that increase in magnitude over time. In one possible approach, the magnitude of the pulses is increased with each successive pulse by a predetermined step size, e.g., 0.2–0.4 V. $V_{pgm}$ can be applied to the control gates (or, in some cases, steering gates) of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{pgm}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," published Feb. 3, 2005; both of which are incorporated herein by reference in their entirety.

However, bit line-to-bit line coupling can disrupt programming in various situations. Bit lines are typically metal lines that run close together across a memory array or chip or other set of non-volatile storage elements. There is a need for a mechanism to address such coupling.

SUMMARY OF THE INVENTION

A method is provided for programming non-volatile memory elements in which the effects of bit line-to-bit line coupling are addressed.

In one embodiment, a method for programming non-volatile storage includes partially inhibiting programming of a first non-volatile storage element during a program voltage by controlling a voltage applied to a first bit line. For example, an inhibit voltage may be provided on the first bit line which counteracts the programming effect of the program voltage. Moreover, during the program voltage, the voltage on the first bit line can transition from the inhibit level to a program level in which the programming effect of the program voltage is not counteracted so that the first non-volatile storage element can be programmed.

The transition in the voltage on the first bit line is coupled to a neighboring bit line which has not been selected for programming, and which has an inhibit voltage applied for the duration of the program voltage. For example, a voltage drop on the first bit line will result in a voltage drop on the neighboring bit line. This coupled voltage drop, if not addressed, can be sufficient to cause the select gate of the neighboring bit line to temporarily open, allowing the inhibited string to discharge and potentially resulting in inadvertent programming of storage elements on the inhibited string in the process known as program disturb. To account for the coupled voltage, a select gate voltage can be adjusted during the transition in the voltage applied to the first bit line. For example, the select gate voltage can be temporarily dropped when the bit line voltage on the inhibited bit line drops due to coupling. This temporary drop ensures that the biasing of the select gate on the inhibited bit line is not sufficient to open the select gate.

BRIEF DESCRIPTION OF THE DRAWINGS

FIGS. 9A–C show various threshold voltage distributions and describe a process for programming non-volatile memory.

DETAILED DESCRIPTION

Figure 1:
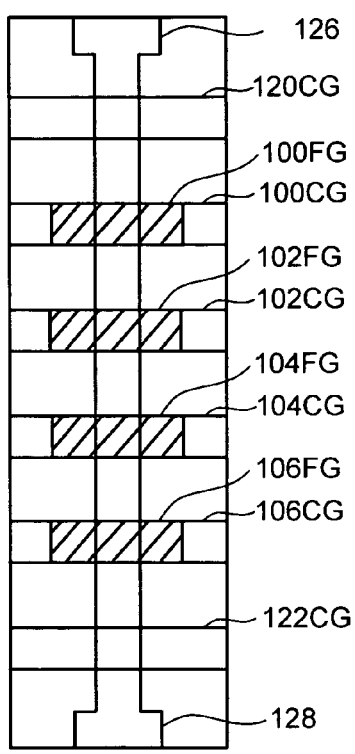
FIG. 1 is a top view of a NAND string.
Figure 2:
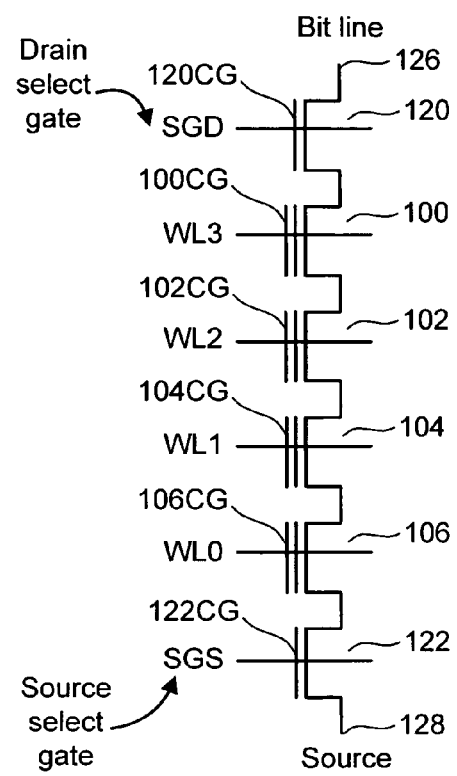
FIG. 2 is an equivalent circuit diagram of the NAND string of FIG. 1.

One example of a non-volatile memory system suitable for implementing the present invention uses the NAND flash memory structure, in which multiple transistors are arranged in series between two select gates in a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gates 120 and 122 connect the NAND string to bit line contact 126 and source line contact 128, respectively. Select gates 120 and 122 are controlled by applying the appropriate voltages to control gates 120CG and 122CG, respectively. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG are connected to word lines WL3, WL2, WL1 and WL0, respectively. In one possible design, transistors 100, 102, 104 and 106 are each memory cells or storage elements. In other designs, the memory elements may include multiple transistors or may be different than those depicted in FIGS. 1 and 2. Select gate 120 is connected to drain select line SGD, while select gate 122 is connected to source select line SGS.

Figure 3:
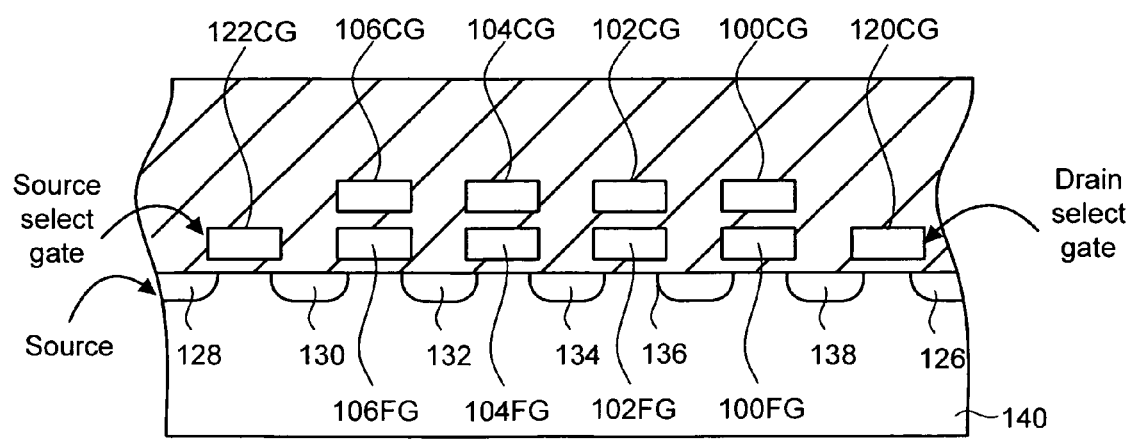
FIG. 3 is a cross-sectional view of the NAND string of FIG. 1.

FIG. 3 provides a cross-sectional view of the NAND string described above. The transistors of the NAND string are formed in p-well region 140. Each transistor includes a stacked gate structure that includes a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory elements (100, 102, 104 and 106) form the word lines. N+ doped layers 130, 132, 134, 136 and 138 are shared between neighboring elements, whereby the elements are connected to one another in series to form the NAND string. These N+ doped layers form the source and drain of each of the elements. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1–3 show four memory elements in the NAND string, the use of four transistors is provided only as an example. A NAND string used with the technology described herein can have less than four memory elements or more than four memory elements. For example, some NAND strings will include eight, sixteen, thirty-two, sixty-four or more memory elements. The discussion herein is not limited to any particular number of memory elements in a NAND string.

Each memory element can store data represented in analog or digital form. When storing one bit of digital data, the range of possible threshold voltages of the memory element is divided into two ranges, which are assigned logical data "1" and "0." In one example of a NAND-type flash memory, the voltage threshold is negative after the memory element is erased, in what may be defined as the logic "1" state. The threshold voltage is positive after a program operation, in what may be defined as the logic "0" state. When the threshold voltage is negative and a read is attempted by applying 0 V to the control gate, the memory element will turn on to indicate logic one is being stored. When the threshold voltage is positive and a read operation is attempted by applying 0 V to the control gate, the memory element will not turn on, which indicates that logic zero is stored.

A memory element can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory element and the threshold voltage ranges of the element depends upon the data encoding scheme adopted for the memory elements. For example, U.S. Pat. No. 6,222,762 and U.S. patent application Ser. No. 10/461,244, "Tracking Cells For A Memory System," filed on Jun. 13, 2003, and published as U.S. Patent Application Publication 2004/0255090 on Dec. 16, 2004, both of which are incorporated herein by reference in their entirety, describe various data encoding schemes for multi-state flash memory elements.

Relevant examples of NAND-type flash memories and their operation are provided in U.S. Pat. Nos. 5,386,422, 5,570,315, 5,774,397, 6,046,935, 6,456,528 and 6,522,580, each of which is incorporated herein by reference in its entirety. Other types of non-volatile memory, in addition to NAND flash memory, can also be used with the present invention.

Another type of memory element useful in flash EEPROM systems is the charge trapping element, which utilizes a non-conductive dielectric material in place of a conductive floating gate to store charge in a non-volatile manner. Such an element is described in an article by Chan et al., "A True Single-Transistor Oxide-Nitride-Oxide EEPROM Device," IEEE Electron Device Letters, Vol. EDL-8, No. 3, March 1987, pp. 93–95. A triple layer dielectric formed of silicon oxide, silicon nitride and silicon oxide ("ONO") is sandwiched between a conductive control gate and a surface of a semi-conductive substrate above the memory element channel. The element is programmed by injecting electrons from the element channel into the nitride, where they are trapped and stored in a limited region. This stored charge then changes the threshold voltage of a portion of the channel of the element in a manner that is detectable. The element is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497–501, which describes a similar element in a split-gate configuration where a doped polysilicon gate extends over a portion of the memory element channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. The memory elements described in this paragraph can also be used with the present invention.

Another approach to storing two bits in each element has been described by Eitan et al., "NROM: A Novel Localized Trapping, 2-Bit Nonvolatile Memory Cell," IEEE Electron Device Letters, vol. 21, no. 11, November 2000, pp. 543–545, which describes an ONO dielectric layer that extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. The memory elements described in this paragraph can also be used with the present invention.

Figure 4:
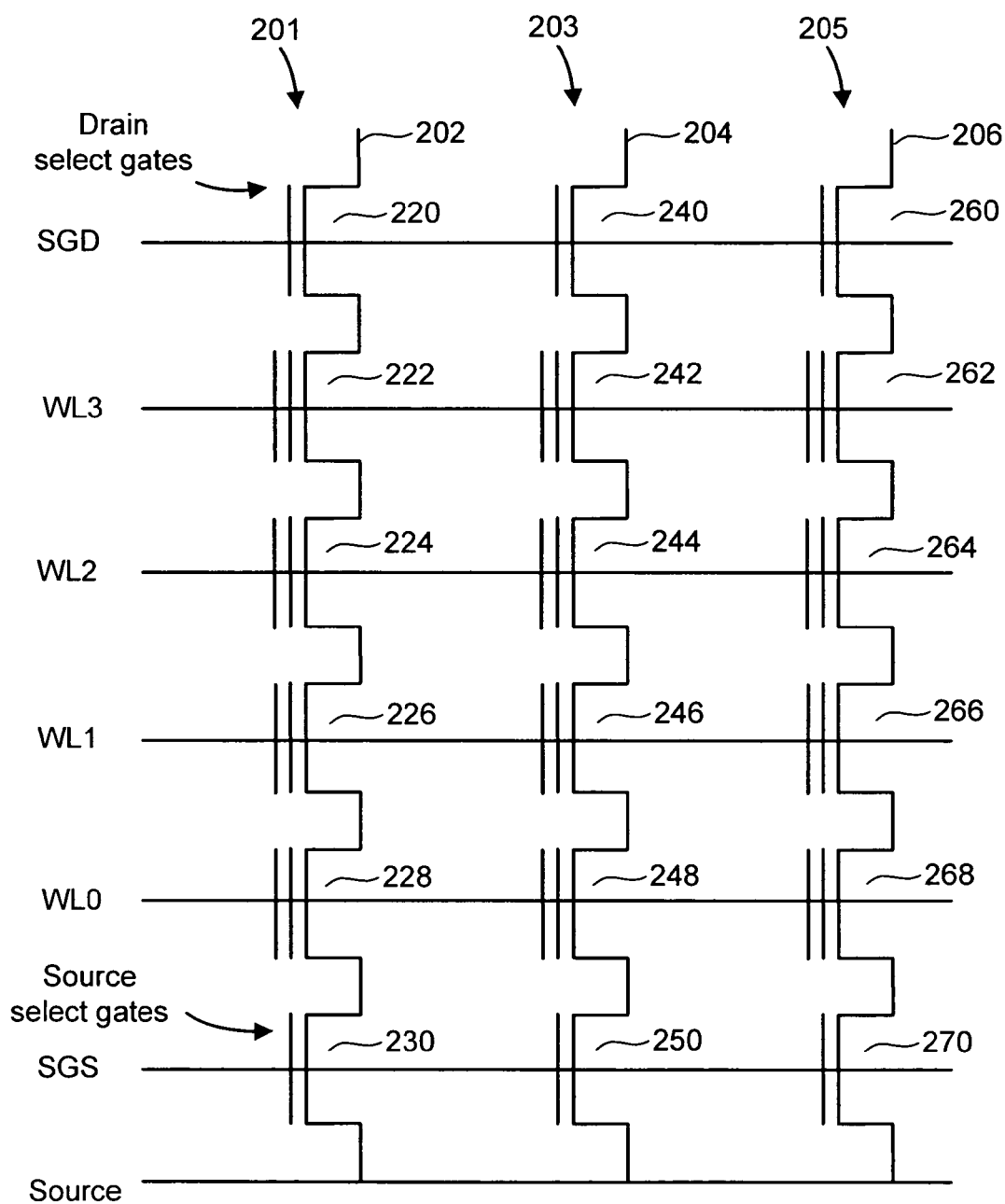
FIG. 4 is a circuit diagram depicting three NAND strings.

FIG. 4 is a circuit diagram depicting three NAND strings. A typical architecture for a flash memory system using a NAND structure will include several NAND strings. For example, three NAND strings 201, 203 and 205 are shown in a memory array having many more NAND strings. Each of the NAND strings includes two select transistors and four memory elements. For example, NAND string 201 includes select transistors 220 and 230, and memory elements 222, 224, 226 and 228. NAND string 203 includes select transistors 240 and 250, and memory elements 242, 244, 246 and 248. NAND string 205 includes select transistors 260 and 270, and memory elements 262, 264, 266 and 268. Each NAND string is connected to the source line by its select transistor (e.g., select transistor 230, 250 or 270). A selection line SGS is used to control the source side select gates. The various NAND strings 201, 203 and 205 are connected to respective bit lines 202, 204 and 206, by select transistors 220, 240, 260, etc., which are controlled by drain select line SGD. In other embodiments, the select lines do not necessarily need to be in common. Word line WL3 is connected to the control gates for memory element 222 and memory element 242. Word line WL2 is connected to the control gates for memory element 224 and memory element 244. Word line WL1 is connected to the control gates for memory element 226 and memory element 246. Word line WL0 is connected to the control gates for memory element 228 and memory element 248. As can be seen, each bit line and the respective NAND string comprise the columns of the array or set of memory elements. The word lines (WL3, WL2, WL1 and WL0) comprise the rows of the array or set. Each word line connects the control gates of each memory element in the row. For example, word line WL2 is connected to the control gates for memory elements 224, 244 and 264.

Each memory element can store data (analog or digital). When storing one bit of digital data, the range of possible threshold voltages of the memory element is divided into two ranges which are assigned logical data "1" and "0." In one example of a NAND type flash memory, the voltage threshold is negative after the memory element is erased, and defined as logic "1." The threshold voltage after a program operation is positive and defined as logic "0." When the threshold voltage is negative and a read is attempted, the memory element will turn on to indicate logic one is being stored. When the threshold voltage is positive and a read operation is attempted, the memory element will not turn on, which indicates that logic zero is stored. A memory element can also store multiple levels of information, for example, multiple bits of digital data. In this case, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00."

Relevant examples of NAND type flash memories and their operation are provided in U.S. Pat. Nos. 5,522,580, 5,570,315, 5,774,397, 6,046,935 and 6,456,528, each of which is incorporated herein by reference.

When programming a flash memory element, a program voltage is applied to the control gate of the element and the bit line associated with the element is grounded. Electrons from the channel are injected into the floating gate. When electrons accumulate in the floating gate, the floating gate becomes negatively charged and the threshold voltage of the element is raised. To apply the program voltage to the control gate of the element being programmed, that program voltage is applied on the appropriate word line. As discussed above, that word line is also connected to one element in each of the other NAND strings that share the same word line. For example, when programming element 224 of FIG. 4, the program voltage will also be applied to the control gate of element 244. A problem arises when it is desired to program one element on a word line without programming other elements connected to the same word line, for example, when it is desired to program element 224 but not element 244. Because the program voltage is applied to all elements connected to a word line, an unselected element (an element that is not to be programmed) on the word line, especially an element adjacent to the element selected for programming, may become inadvertently programmed, in the process referred to as program disturb. For example, when programming element 224, there is a concern that the adjacent element 244 might unintentionally be programmed.

Several techniques can be employed to prevent program disturb. In one method known as "self boosting," the channels associated with the unselected bit lines are electrically isolated and a pass voltage (e.g., 10 V) is applied to the unselected word lines during programming. The unselected word lines couple to the channels associated with the unselected bit lines, causing a voltage (e.g., 8 V) to exist in the channel of the unselected bit lines, which tends to reduce program disturb. Thus, self boosting causes a voltage boost to exist in the channel which tends to lower the voltage across the tunnel oxide and hence reduce program disturb.

A NAND string is typically (but not always) programmed from the source side to the drain side, for example, from memory element 228 to memory element 222. For example, assume the NAND string 203 is programmed before the NAND string 201. When the programming process is ready to program the last (or near the last) memory element of the NAND string 201, if all or most of the previously programmed memory elements on the NAND string being inhibited (e.g., NAND string 203) were programmed, then there is negative charge in the floating gates of the previously programmed memory elements. As a result, the boosting potential does not get high enough in portions of the NAND string 203 and there still may be program disturb on the elements in the NAND string 203 associated with the last few word lines. For example, when programming element 222 on NAND string 201, if elements 248, 246 and 244 on NAND string 203 were previously programmed, then each of those transistors (244, 246, 248) have a negative charge on their floating gate which will limit the boosting level of the self boosting process and possibly cause program disturb on element 242.

Local Self Boosting ("LSB") and Erased Area Self Boosting ("EASB") attempt to address the shortcomings of conventional self boosting by isolating the channel of previously programmed elements from the channel of the element being inhibited. For example, if element 224 of FIG. 4 is being programmed, LSB and EASB attempt to inhibit programming in element 244 by isolating the channel of element 244 from the previously programmed elements (246 and 248). With the LSB technique, the bit line for the element being programmed is at ground and the bit line of the NAND string with the element being inhibited is at $V_{dd}$. The program voltage $V_{pgm}$ (e.g., 20 V) is driven on the selected word line. The word lines neighboring the selected word line are at 0 V and the remaining non-selected word lines are at $V_{pass}$. For example, bit line 202 is at 0 V and bit line 204 is at $V_{dd}$. Drain select SCG is at $V_{dd}$ and source select SGS is at 0 V. Selected word line WL2 (for programming element 224) is at $V_{pgm}$. Neighboring word lines WL1 and WL3 are at 0 V, and other word lines (e.g., WL0) are at $V_{pass}$.

EASB is similar to LSB with the exception that only the source side neighbor word line is at 0 V. The drain side neighbor word line is at $V_{pass}$. If $V_{pass}$ is too low, boosting in the channel will be insufficient to prevent program disturb. If $V_{pass}$ is too high, unselected word lines will be programmed. For example, WL1 would be at 0 V instead of $V_{pass}$, while WL3 would be at $V_{pass}$. In one embodiment, $V_{pass}$ is 7–10 V.

While LSB and EASB provide an improvement over self boosting, they also present a problem that depends on whether the source side neighbor element (element 246 is the source side neighbor of element 244) is programmed or erased. If the source side neighbor element is programmed, then there is a negative charge on its floating gate. Moreover, with 0 V applied to the control gate, there is a highly reverse biased junction under the negatively charged gate which can cause Gate Induced Drain Leakage (GIDL), in which electrons leak into the boosted channel. GIDL occurs with a large bias in the junction and a low or negative gate voltage, which is precisely the case when the source side neighbor element is programmed and the drain junction is boosted. GIDL causes the boosted voltage to leak away prematurely, resulting in a programming error, and is more severe with the abruptly and highly doped junctions, which are required as element dimensions are scaled. If the leakage current is high enough, the boosting potential in the channel region will decrease possibly resulting in program disturb. Furthermore, the closer the word line being programmed is to the drain, the less charge is present in the boosted junction. Thus, the voltage in the boosted junction will drop quickly, causing program disturb.

If the source side neighbor memory element is erased, then there is positive charge on the floating gate and the threshold voltage of the transistor will likely be negative. The transistor may not turn off even when 0 V are applied to the word line. If the memory element is on, then the NAND string is not operating in EASB mode. Rather, that NAND string is operating in self boosting mode, which has the problems discussed above. This scenario is most likely if other source side elements are programmed, which limits source side boosting. This issue is most problematic with shorter channel lengths.

Figure 5:
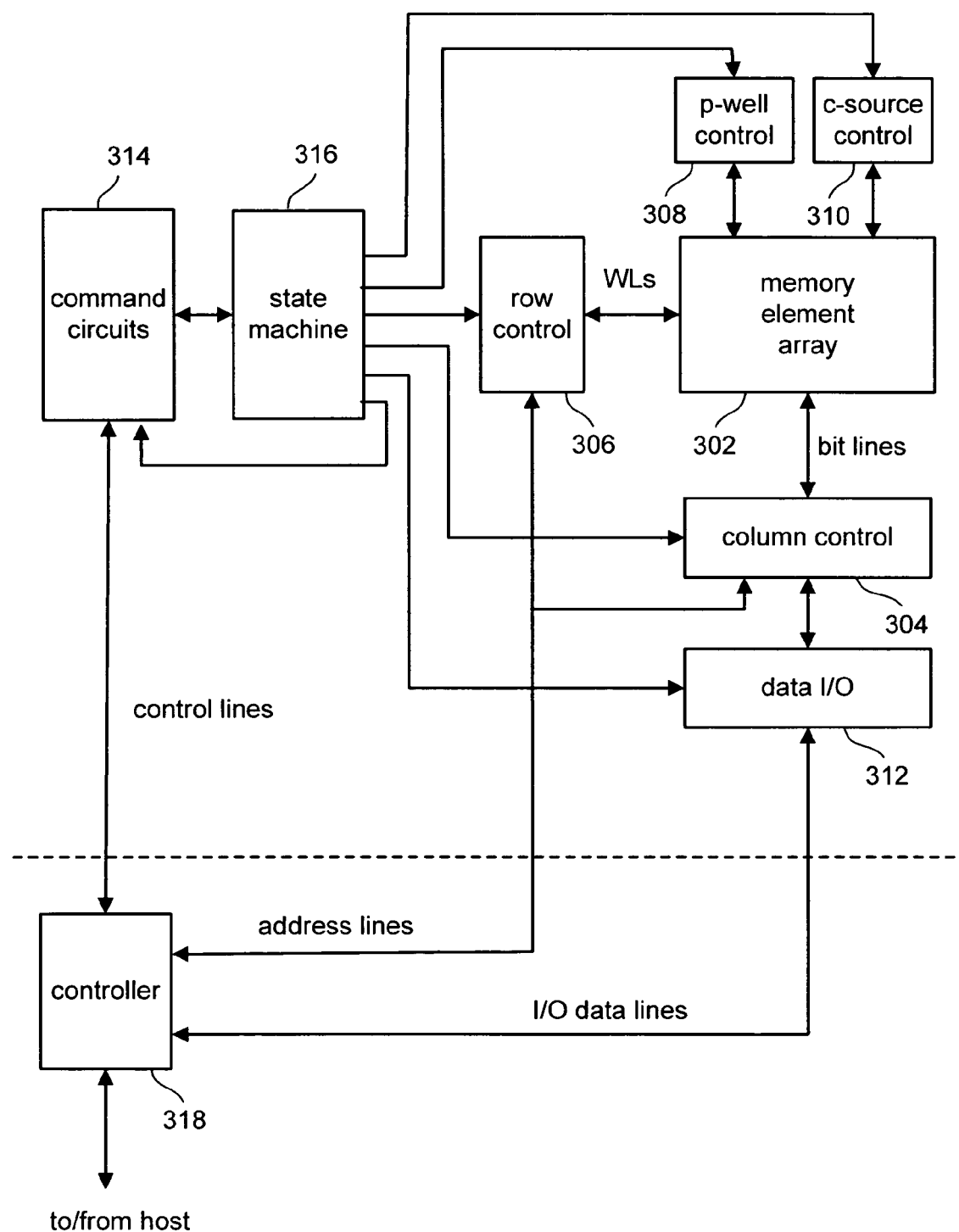
FIG. 5 is a block diagram of a non-volatile memory system.

FIG. 5 is a block diagram of one design of a flash memory system that can be used to implement the present invention. In this system, a memory element array 302 is controlled by a column control circuit 304, a row control circuit 306, a c-source control circuit 310 and a p-well control circuit 308. The column control circuit 304 is connected to the bit lines of memory element array 302 for reading data stored in the memory elements, for determining a state of the memory elements during a program operation, and for controlling potential levels of the bit lines to promote or inhibit the programming. The row control circuit 306 is connected to the word lines to select one of the word lines, and to apply read, program and erase voltages. For example, program voltage levels used in EPROM and flash memory circuits are higher than the voltages normally used in memory circuits, and are often higher than the voltage supplied to the circuit. These higher voltages can be produced by a charge pump in row control circuit 306 (or elsewhere), which in one example essentially dumps charge into the capacitive word line to charge it to a higher voltage. The charge pump receives an input at a voltage $V_{in}$ and provides an output at a higher voltage $V_{out}$ by boosting the input voltage progressively in a series of voltage multiplier stages. The voltage output is supplied to a load, for example, the word line of an EPROM memory circuit. In some implementations, there is a feedback signal from the load to the charge pump. The charge pump turns off in response to a signal indicating that the load has reached a predetermined voltage. Alternatively, a shunt is used to prevent overcharging once the load reaches the predetermined voltage. However, this consumes more power and is undesirable in low power applications. More information about charge pumps can be found in U.S. Pat. No. 6,734,718, incorporated herein by reference in its entirety.

The c-source control circuit 310 controls a common source line (labeled as "C-source" in FIG. 6) connected to the memory elements. The p-well control circuit 308 controls the p-well voltage.

The data stored in the memory elements is read out by the column control circuit 304 and output to external I/O lines via data input/output buffer 312. Program data to be stored in the memory elements is input to the data input/output buffer 312 via the external I/O lines, and transferred to the column control circuit 304. The external I/O lines are connected to a controller 318.

Command data for controlling the flash memory device is input to the controller 318. The command data informs the flash memory of what operation is requested. The input command is transferred to the state machine 316, which controls the column control circuit 304, the row control circuit 306, the c-source control 310, the p-well control circuit 308 and the data input/output buffer 312. The state machine 316 can also output status data of the flash memory such as READY/BUSY or PASS/FAIL. In some designs, state machine 316 is responsible for managing the programming process, including the processes depicted in the flow charts described below.

The controller 318 is connected or connectable with a host system such as a personal computer, a digital camera, personal digital assistant, etc. The controller 318 communicates with the host in order to receive commands and data from the host, and provide data and status information to the host. The controller 318 converts commands from the host into command signals that can be interpreted and executed by command circuits 314, which are in communication with the state machine 316. Controller 318 typically contains buffer memory for the user data being written to, or read from, the memory array. In some designs, the programming process can be managed by the controller.

One example memory system comprises one integrated circuit that includes controller 318, and one or more integrated circuit chips that each contains a memory array and associated control, input/output and state machine circuits. The trend is to integrate the memory arrays and controller circuits of a system together on one or more integrated circuit chips. The memory system may be embedded as part of the host system, or may be included in a memory card or other package that is removably inserted into the host systems. Such a removable card may include the entire memory system (e.g., including the controller) or just the memory array(s) and associated peripheral circuits, with the controller being embedded in the host. Thus, the controller or control capability can be embedded in the host or included within a removable memory system.

In some implementations, some of the components of FIG. 5 can be combined. In various designs, one or more of the components of FIG. 5, other than memory element array 302, can be thought of as a managing circuit. For example, one or more managing circuits may include any one of, or a combination of, a command circuit, a state machine, a row control circuit, a column control circuit, a well control circuit, a source control circuit or a data I/O circuit.

Figure 6:
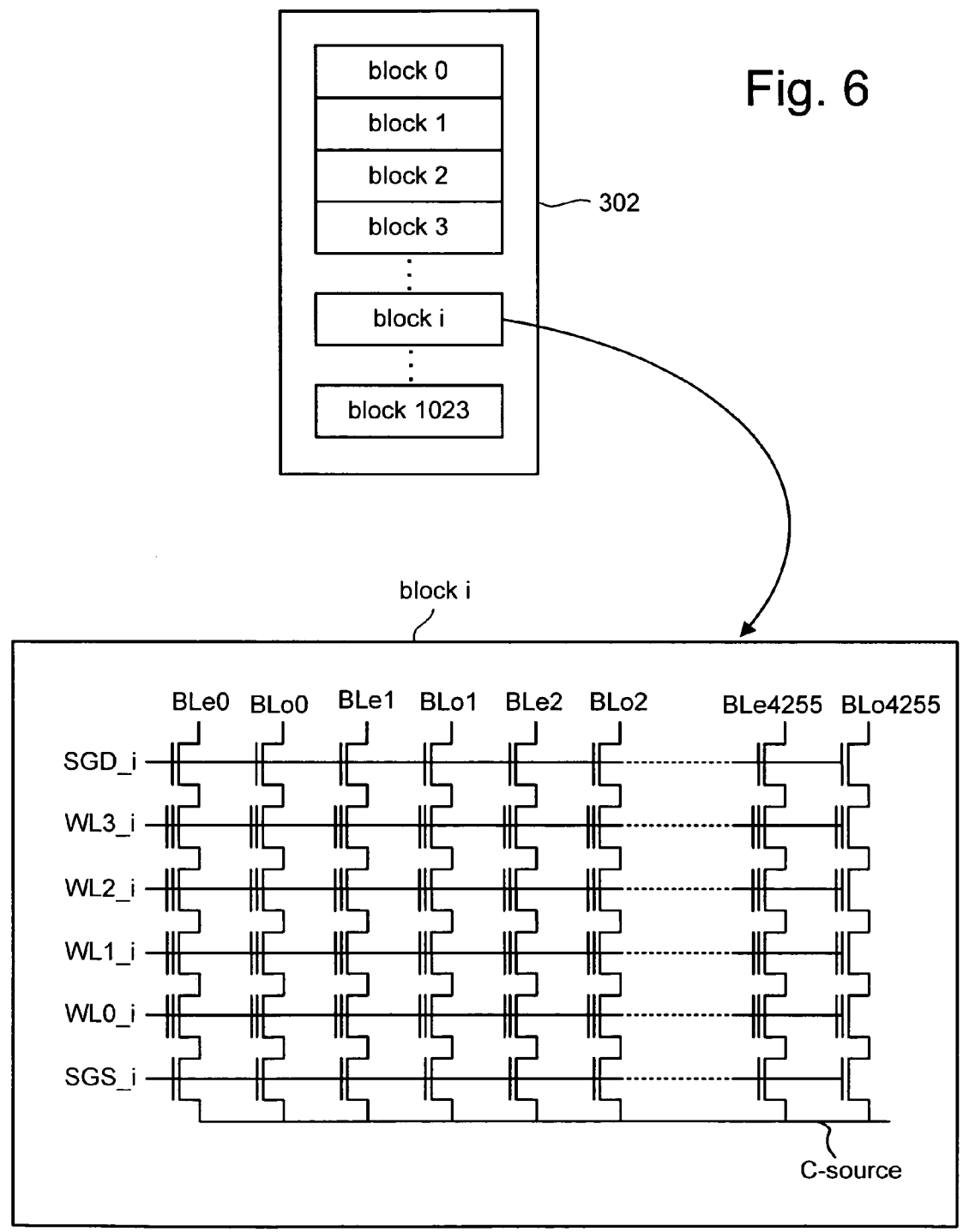
FIG. 6 illustrates an example of an organization of a memory array.

FIG. 6 provides an example structure of memory element array 302. As one example, a NAND flash EEPROM is described that is partitioned into 1,024 blocks. In an erase operation, the data stored in each block is simultaneously erased. In one design, the block is the minimum unit of elements that are simultaneously erased. In each block, in this example, there are 8,512 columns that are divided into even columns and odd columns. The bit lines are also divided into even bit lines (BLe) and odd bit lines (BLo). Four memory elements are shown connected in series to form a NAND string. Although four elements are shown to be included in each NAND string, more or less than four memory elements can be used. One terminal of the NAND string is connected to a corresponding bit line via a select transistor SGD, and another terminal is connected to the c-source line via a second select transistor SGS.

During one configuration of read and programming operations, 4,256 memory elements are simultaneously selected. The memory elements selected have the same word line and the same kind of bit line (e.g., even bit lines or odd bit lines). Therefore, 532 bytes of data, which form a logical page, can be read or programmed simultaneously, and one block of the memory can store at least eight logical pages (four word lines, each with odd and even pages). For multi-state memory elements, when each memory element stores two bits of data, where each of these two bits are stored in a different page, one block stores sixteen logical pages. Other sized blocks and pages can also be used with the present invention. Additionally, architectures other than those of FIGS. 5 and 6 can also be used to implement the present invention. For example, in one design, the bit lines are not divided into odd and even bit lines so that all bit lines can be programmed and read concurrently (or not concurrently).

Memory elements can be erased by raising the p-well to an erase voltage (e.g., 20 V) and grounding the word lines of a selected block. The source and bit lines are floating. Erasing can be performed on the entire memory array, separate blocks, or another unit of the memory elements which is a portion of the memory device. Electrons are transferred from the floating gate to the p-well region so that the threshold voltage becomes negative, in one possible approach.

In the read and verify operations, the select gates (SGD and SGS) and the unselected word lines (e.g., WL0, WL2 and WL3, when WL1 is the selected word line) are raised to a read pass voltage (e.g., 4.5 V) to make the transistors operate as pass gates. The selected word line WL1 is connected to a voltage, a level of which is specified for each read and verify operation in order to determine whether a threshold voltage of the concerned memory element is above or below such level. For example, in a read operation for a two-level memory element, the selected word line WL1 may be grounded, so that it is detected whether the threshold voltage is higher than 0 V. In a verify operation for a two level memory element, the selected word line WL1 is connected to 0.8 V, for example, so that it is verified whether or not the threshold voltage has reached at least 0.8 V. The source and p-well are at 0 V. The selected bit lines, assumed to be the even bit lines (BLe), are pre-charged to a level of, for example, 0.7 V. If the threshold voltage is higher than the read or verify level on the word line, the potential level of the bit line (BLe) associated with the element of interest maintains the high level because of the non-conductive memory element. On the other hand, if the threshold voltage is lower than the read or verify level, the potential level of the concerned bit line (BLe) decreases to a low level, for example, less than 0.5 V, because the conductive memory element discharges the bitline. The state of the memory element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

As described above, each block can be divided into a number of pages. In one approach, a page is a unit of programming. In some implementations, the individual pages may be divided into segments and the segments may contain the fewest number of elements that are written at one time as a basic programming operation. One or more pages of data are typically stored in one row of memory elements. A page can store one or more sectors. A sector includes user data and overhead data, such as an Error Correction Code (ECC) that has been calculated from the user data of the sector. A portion of the controller calculates the ECC when data is being programmed into the array, and also checks the data using the ECC when the data is read from the array. Alternatively, the ECCs and/or other overhead data are stored in different pages, or even different blocks, than the user data to which they pertain. In other designs, other parts of the memory device, such as the state machine, can calculate the ECC.

A sector of user data is typically 512 bytes, corresponding to the size of a sector in magnetic disk drives. Overhead data is typically an additional 16–20 bytes. A large number of pages form a block that includes anywhere from 8 pages, for example, up to 32, 64 or more pages.

Figure 7:
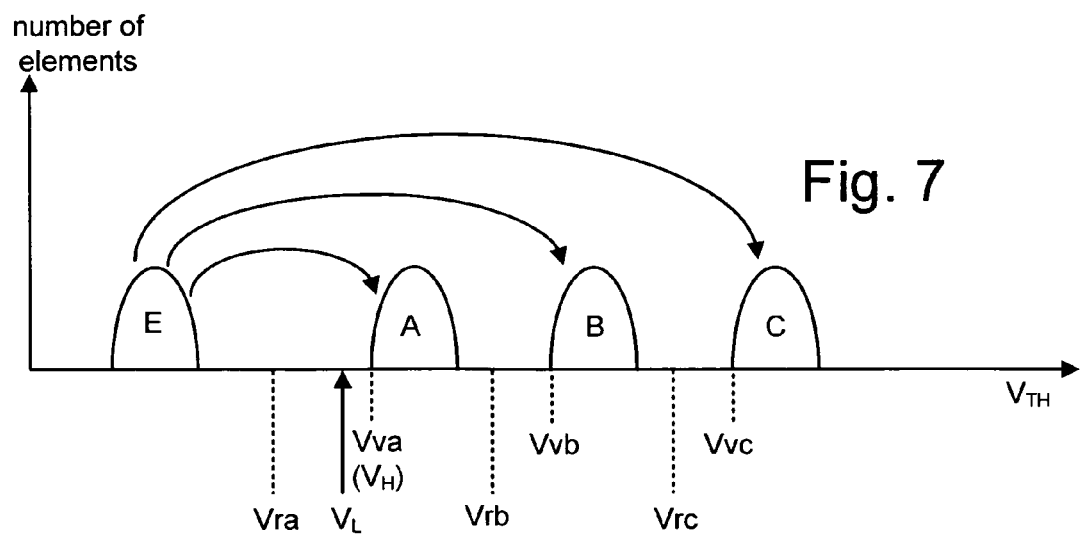
FIG. 7 depicts an example set of threshold voltage distributions in a multi-state device with direct programming from the erased state to a programmed state.

FIG. 7 illustrates threshold voltage distributions for the memory element array when each memory element stores two bits of data. E depicts a first threshold voltage distribution for erased memory elements. A, B and C depict three threshold voltage distributions for programmed memory elements. In one design, the threshold voltages in the E distribution are negative and the threshold voltages in the A, B and C distributions are positive.

Each distinct threshold voltage range corresponds to predetermined values for the set of data bits. The specific relationship between the data programmed into the memory element and the threshold voltage levels of the element depends upon the data encoding scheme adopted for the elements. One example assigns "11" to the threshold voltage range E (state E), "10" to the threshold voltage range A (state A), "00" to the threshold voltage range B (state B) and "01" to the threshold voltage range C (state C). However, in other designs, other schemes are used.

Three read reference voltages, Vra, Vrb and Vrc, are used for reading data from memory elements. By testing whether the threshold voltage of a given memory element is above or below Vra, Vrb and Vrc, the system can determine the state of the memory element. Three verify reference voltages, Vva, Vvb and Vvc are also indicated. When programming memory elements to state A, B or C, the system will test whether those memory elements have a threshold voltage greater than or equal to Vva, Vvb or Vvc, respectively. $V_L$ and $V_H$ are lower and higher voltage thresholds, respectively, for use in programming a storage element to state A using coarse/fine programming, as discussed further below in connection with FIGS. 10 and 16.

In one approach, known as full sequence programming, memory elements can be programmed from the erase state E directly to any of the programmed states A, B or C (as depicted by the curved arrows). For example, a population of memory elements to be programmed may first be erased so that all memory elements in the population are in the erased state E. While some memory elements are being programmed from state E to state A, other memory elements are being programmed from state E to state B and/or from state E to state C.

Figure 8:
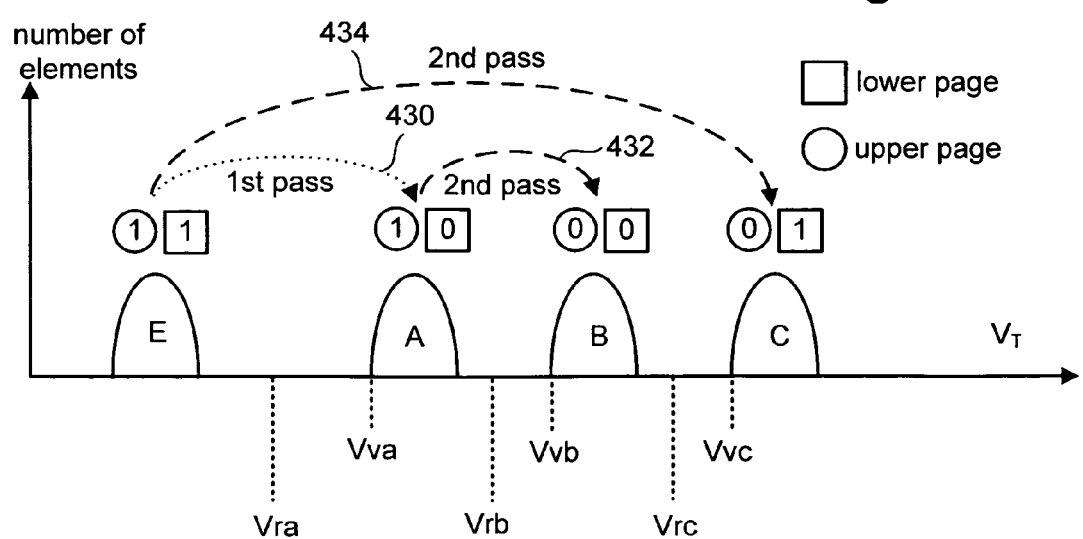
FIG. 8 depicts an example set of threshold voltage distributions in a multi-state device with two-pass programming from the erased state to a programmed state.

FIG. 8 illustrates an example of a two-pass technique of programming a multi-state memory element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the element's threshold voltage level is set according to the bit to be programmed into the lower logical page. If that bit is a logic "1," the threshold voltage is not changed since it is in the appropriate state as a result of having been previously erased. However, if the bit to be programmed is a logic "0," the threshold level of the element is increased to be state A, as shown by arrow 430. That concludes the first programming pass.

In a second programming pass, the element's threshold voltage level is set according to the bit being programmed into the upper logical page. If the upper logical page bit is to store a logic "1," then no programming occurs since the element is in one of the states E or A, depending upon the programming of the lower page bit, both of which carry an upper page bit of "1." If the upper page bit is to be a logic "0," then the threshold voltage is shifted. If the first pass resulted in the element remaining in the erased state E, then, in the second phase, the element is programmed so that the threshold voltage is increased to be within state C, as depicted by arrow 434. If the element had been programmed into state A as a result of the first programming pass, then the memory element is further programmed in the second pass so that the threshold voltage is increased to be within state B, as depicted by arrow 432. The result of the second pass is to program the element into the state designated to store a logic "0" for the upper page without changing the data for the lower page.

In one approach, a system can be set up to perform full sequence writing if enough data is written to fill up an entire page. If not enough data is written for a full page, then the programming process can program the lower page with the data received. When subsequent data is received, the system will then program the upper page. In yet another approach, the system can start writing in the mode that programs the lower page and convert to full sequence programming mode if enough data is subsequently received to fill up all, or most of, a word line's memory elements. More details of such an approach are disclosed in U.S. Patent Application titled "Pipelined Programming of Non-Volatile Memories Using Early Data," Ser. No. 11/013,125, filed on Dec. 14, 2004 by inventors Sergy A. Gorobets and Yan Li, incorporated herein by reference in its entirety.

FIGS. 9A–C depict another process for programming non-volatile memory that reduces floating gate-to-floating gate coupling by, for any particular memory element, writing to that particular memory element with respect to a particular page subsequent to writing to adjacent memory elements for previous pages. In one example implementation, each of the non-volatile memory elements store two bits of data, using four data states. For example, assume that state E is the erased state and states A, B and C are the programmed states. State E stores data 11, state A stores data 01, state B stores data 10 and state C stores data 00. This is an example of non-Gray coding because both bits change between adjacent states A and B. Other encodings of data to physical data states can also be used. Each memory element stores bits from two pages of data. For reference purposes these pages of data will be called upper page and lower page; however, they can be given other labels. For state A, the upper page stores bit 0 and the lower page stores bit 1. For state B, the upper page stores bit 1 and the lower page stores bit 0. For state C, both pages store bit data 0. The programming process has two steps. In the first step, the lower page is programmed. If the lower page is to remain data 1, then the memory element state remains at state E. If the data is to be programmed to 0, then the voltage threshold $V_{TH}$ of the memory element is raised such that the memory element is programmed to state B'. FIG. 9A therefore shows the programming of memory elements from state E to state B', which represents an interim state B; therefore, the verify point is depicted as Vvb', which is lower than Vvb, depicted in FIG. 9C.

In one design, after a memory element is programmed from state E to state B', its neighbor memory element on an adjacent word line is programmed with respect to its lower page. After programming the neighbor memory element, the floating gate-to-floating gate coupling effect will raise the apparent threshold voltage of memory element under consideration, which is in state B'. This will have the effect of widening the threshold voltage distribution for state B' to that depicted as threshold voltage distribution 450 in FIG. 9B. This apparent widening of the threshold voltage distribution will be remedied when programming the upper page.

FIG. 9C depicts the process of programming the upper page. If the memory element is in erased state E and the upper page is to remain at 1, then the memory element will remain in state E. If the memory element is in state E and its upper page data is to be programmed to 0, the threshold voltage of the memory element will be raised so that the memory element is in state A. If the memory element is in state B' with the intermediate threshold voltage distribution 450 and the upper page data is to remain at 1, the memory element will be programmed to final state B. If the memory element is in state B' with the intermediate threshold voltage distribution 450 and the upper page data is to become data 0, the threshold voltage of the memory element will be raised so that the memory element is in state C. The process depicted by FIGS. 9A–C reduces the effect of floating gate-to-floating gate coupling because only the upper page programming of neighbor memory elements will have an effect on the apparent threshold voltage of a given memory element. An example of an alternate state coding is to move from distribution 450 to state C when the upper page data is a 1, and to move to state B when the upper page data is a 0. Although FIGS. 9A–C provide an example with respect to four data states and two pages of data, the concepts taught can be applied to other implementations with more or less than four states and different than two pages. More detail about various programming schemes and floating gate-to-floating gate coupling can be found in U.S. patent application Ser. No. 11/099,133, titled "Compensating For Coupling During Read Operations Of Non-Volatile Memory," filed on Apr. 5, 2005.

Bit Line Coupling

Bit lines are typically metal lines that run close together across a memory array or chip or other set of non-volatile storage elements. Because of this arrangement, bit line-to-bit line coupling can occur in various situations. For example, a transition in a voltage applied to a first bit line can be coupled to one or more neighboring bit lines. In an example scenario, a voltage applied to a selected bit line transitions, e.g., drops, from an inhibit level to a program level. The voltage may be provided at the inhibit level during a portion of a program voltage pulse to control the speed with which the storage element on the selected bit line is programmed. The coupling of the voltage drop to the neighboring bit line can result in inadvertent turn on of a select gate associated with the bit line because the biasing of the select gate, which is a function of the difference between the select gate voltage and the bit line voltage, becomes temporarily larger than the threshold voltage of the select gate. Turn on of the select gate is undesirable because it allows boost voltage in the channel of the unselected string to discharge via the unselected bit line. Such a boosted charge tends to leak away because it is of much lower capacitance than the bit line. As a result, program disturb can occur on the storage elements which are meant to be inhibited. To address this scenario, it is proposed to adjust a select gate control voltage during a transition in the voltage applied to the selected bit line.

Figure 10:
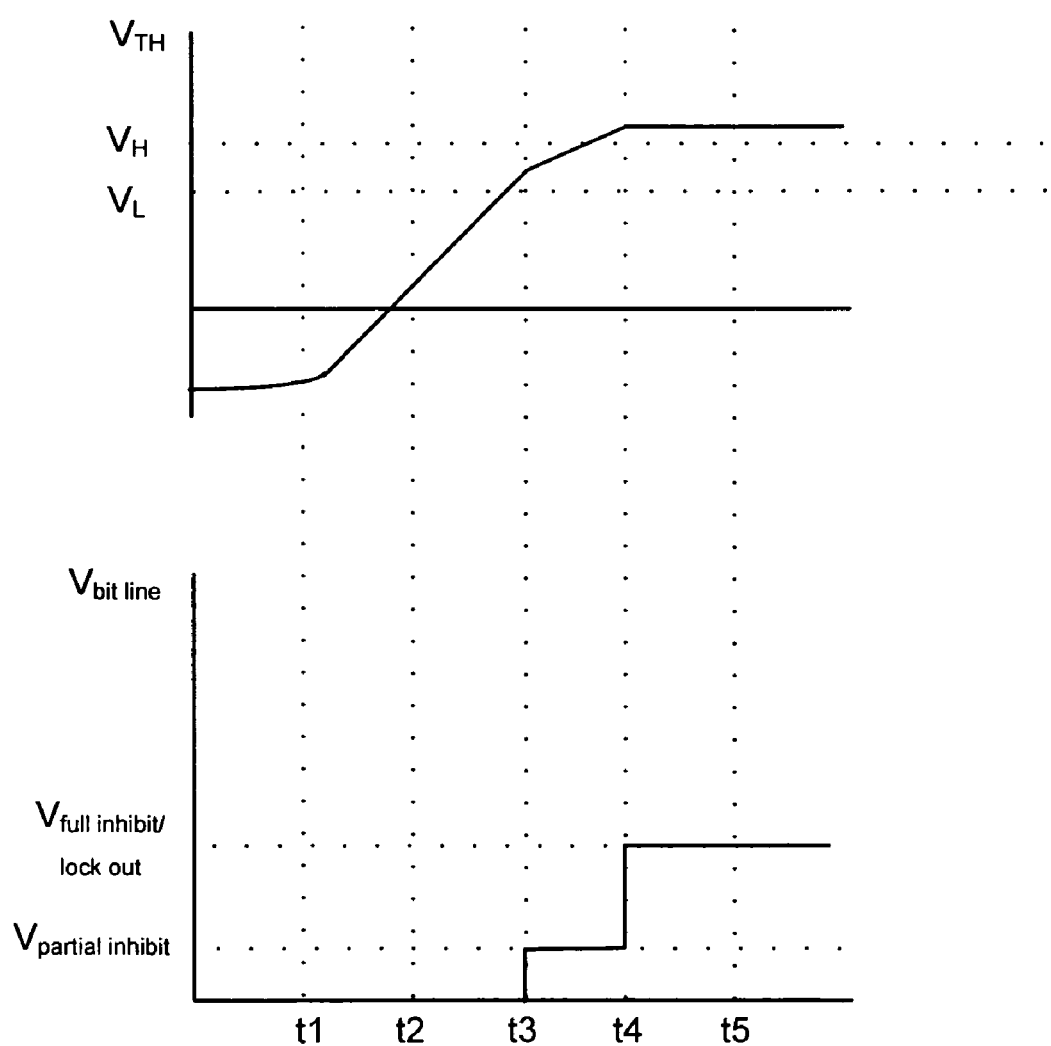
FIG. 10 depicts a time line showing how coarse and fine programming are achieved by setting a bit line inhibit voltage.

The example scenario mentioned above, in which an inhibit voltage is applied to a selected bit line, can be understood by considering the coarse/fine programming technique. FIG. 10 depicts a time line showing how coarse and fine programming are achieved by setting a bit line inhibit voltage. $V_L$ and $V_H$ are lower and higher verify levels, respectively, for a given state. The top portion of the figure indicates a change in a storage element's threshold voltage with time, while the bottom portion indicates a bit line voltage that is applied to the bit line associated with the storage element. Programming of the storage element can be slowed down by providing a bit line inhibit voltage, which counteracts the effect of the applied programming voltage pulses $V_{pgm}$. Coarse/fine programming allows the threshold voltage of a storage element to increase to a desired level more quickly at first, during coarse programming, and then more slowly, during fine programming. In particular, coarse programming occurs when the voltage threshold is below $V_L$, while fine programming occurs when the voltage threshold is between $V_L$ and $V_H$. The storage element is in an inhibit mode, locked out from further programming and verifying, when its voltage threshold exceeds $V_H$. Different $V_L$ and $V_H$ values can be associated with different states of a multi-state storage element, e.g., states A, B and C, to allow coarse/fine programming of the different states. As an example, referring to FIG. 7, $V_L$ and $V_H$ are lower and higher voltage thresholds, respectively, for use in programming a storage element to state A.

An inhibit voltage can thus be used on a selected bit line to partially inhibit programming to provide tightened voltage distributions for the storage elements on a selected string. For example, an inhibit voltage may be applied to multi-state storage elements on a NAND string to tighten the threshold voltage distributions of the different states. This can be achieved by placing the inhibit voltage on the bit line when programming storage elements are nearing the verify level. The inhibit voltage slows programming and thereby allows more precise control of the programmed voltage threshold level. In one approach, the bit line inhibit voltage, typically 0.5–1.0 V, reduces the electric field across the oxide, and is passed to the NAND string during programming. This requires the select gate voltage to be high enough to pass this voltage, typically 2.5 V.

In another embodiment, described in connection with FIGS. 11 and 12 below, the bit line inhibit voltage is high enough, typically 2.5 V, to prevent programming, but is provided during only a portion of the program voltage pulse instead of during the entire program voltage pulse as with the approach of FIG. 10. For example, the bit line can be pulled from 2.5 V to 0 V in the middle of a program pulse, allowing programming to occur for only a portion of the full pulse. Such programming techniques are described further below, as well as in U.S. patent application Ser. No. 10/839,806, entitled "Bitline Governed Approach For Program Control Of Non-Volatile Memory", by Daniel C. Guterman, Nima Mokhlesi, and Yupin Fong, filed May 5, 2004, and incorporated herein by reference in its entirety.

Figure 11:
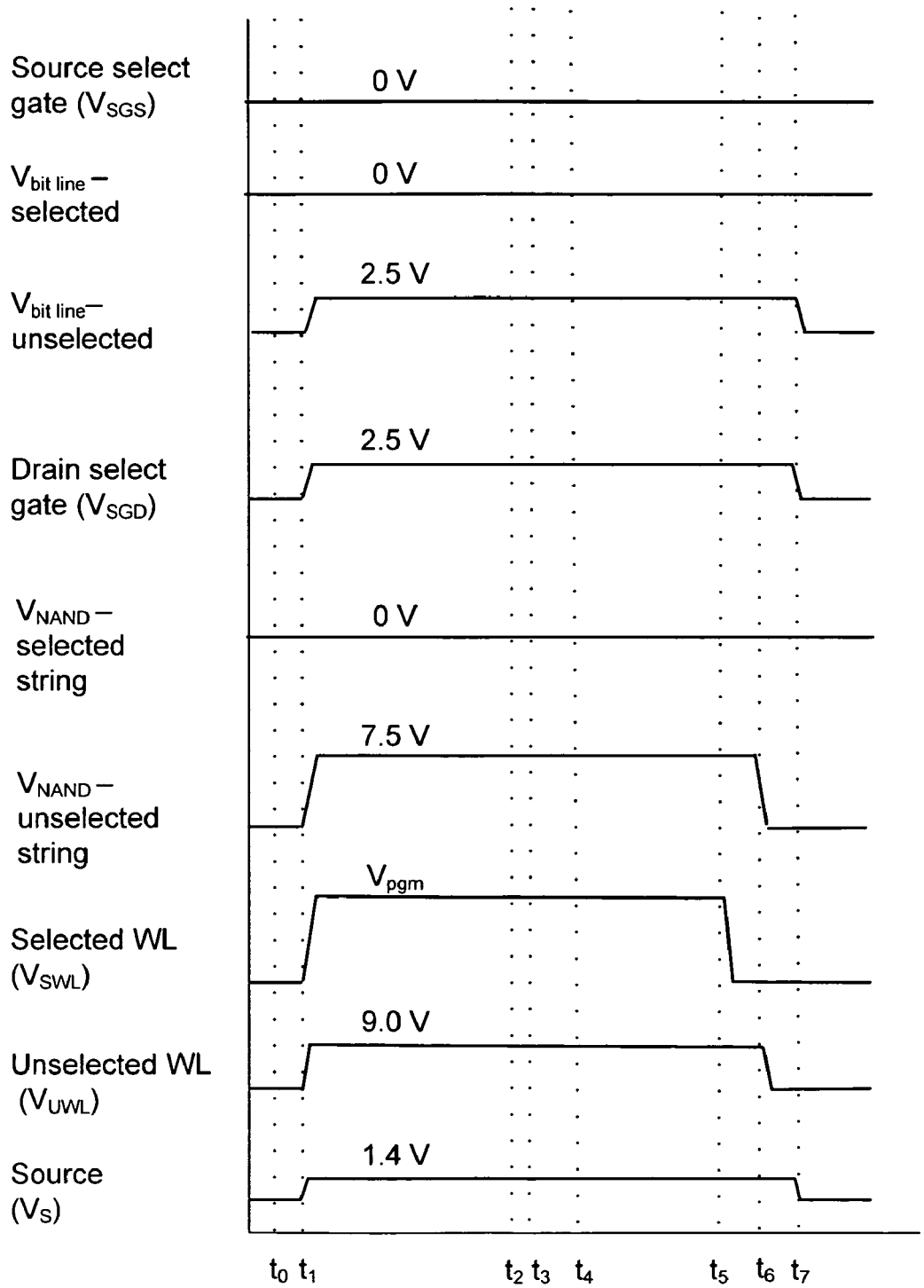
FIG. 11 depicts voltage vs. time relationships for a coarse programming mode.

FIG. 11 depicts voltage vs. time relationships for a coarse programming mode. The source select gate voltage, $V_{SGS}$, is set to zero so that the gate remains closed. The source voltage $V_S$ is set to a nominal level such as 1.4 V to maintain a negative gate-to-source voltage. The bit line voltage, $V_{bit\ line}$, of the selected bit line is set to zero so that it is not inhibited, while $V_{bit\ line}$ of the unselected bit line is set to an inhibit level such as 2.5 V, which is sufficiently large compared to the drain select gate voltage, $V_{SGD}$, to maintain the select gate of the inhibited bit line closed so that the channel of the inhibited string can maintain a boost voltage. For example, $V_{SGD}$ can be set to a constant level such as 2.5 V, which is sufficiently small compared to the unselected bit line voltage, e.g., 2.5 V, to maintain the select gate of the unselected bit line closed. $V_{SGD}$ is also sufficiently large compared to the selected bit line voltage, e.g., 0 V, to maintain the select gate of the selected bit line open. The voltage in the selected NAND string, $V_{NAND}$, is 0 V since the selected bit line is at 0 V and the select gate associated with the bit line is open. The unselected NAND string voltage is boosted, such as to a level of 7.5 V. The selected word line has a voltage, $V_{SWL}$, at a level of a program voltage, $V_{pgm}$, which includes a series of voltage pulses, for instance. One such pulse is shown in FIG. 11. The unselected word lines have a voltage, $V_{UWL}$, such as 9.0 V, which is coupled into the channel of the unselected NAND strings to boost their channels.

Referring to the time points $t_0$–$t_7$, $V_{bit\ line}$ of the unselected string, $V_{SGD}$, $V_{SWL}$, $V_{UWL}$ and $V_S$ can be controlled as indicated to increase to the desired level at $t_1$. At $t_5$, the program pulse $V_{pgm}$ returns to 0 V and, shortly thereafter, at $t_6$, the unselected word line voltage, $V_{UWL}$, returns to 0 V, resulting in a corresponding drop in $V_{NAND}$ of the unselected string. Shortly thereafter, at $t_7$, the voltage waveforms of the unselected string, $V_{SGD}$, and $V_S$ return to 0 V, in one possible implementation.

Figure 12:
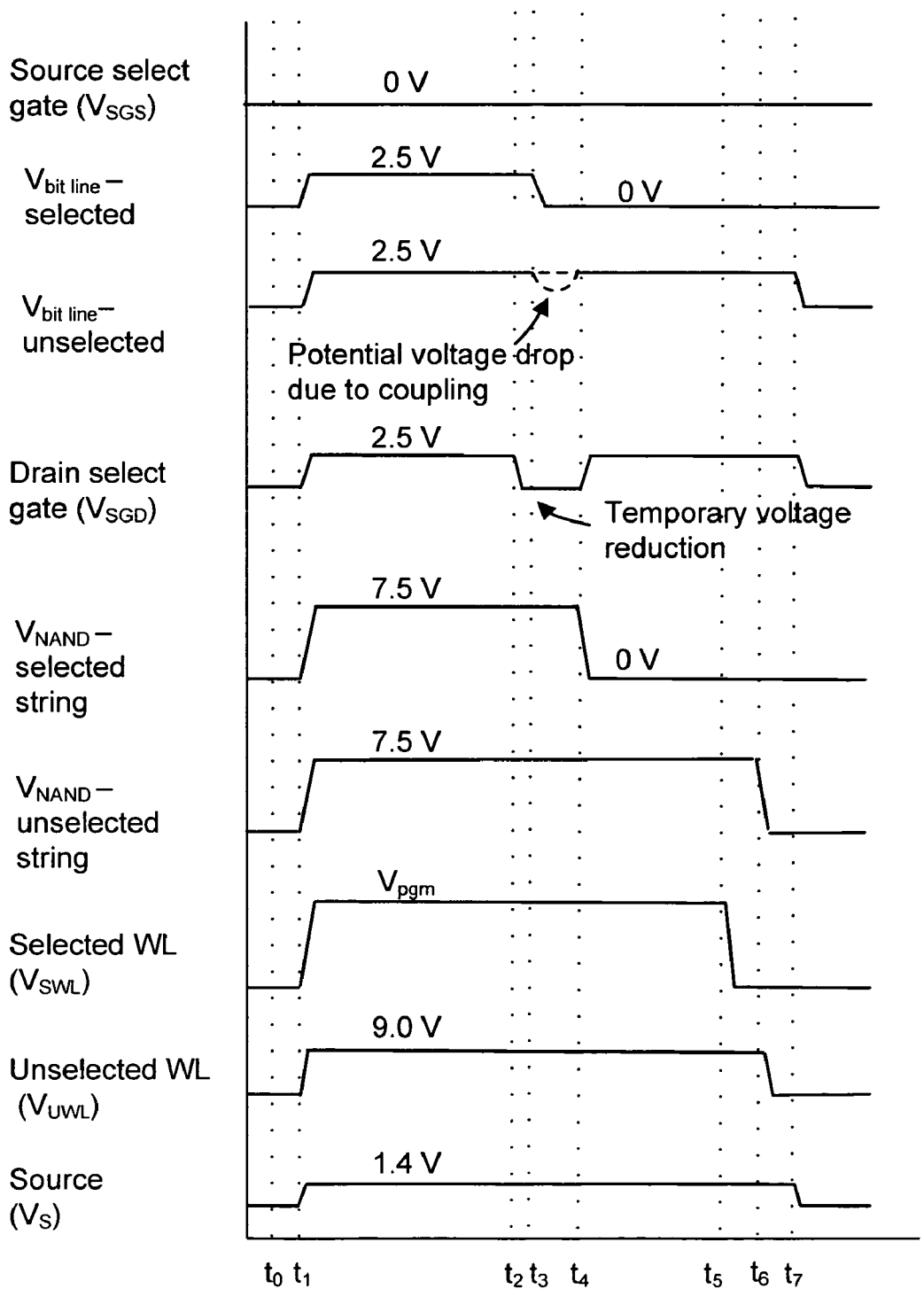
FIG. 12 depicts voltage vs. time relationships for a fine programming mode.

FIG. 12 depicts voltage vs. time relationships for a fine programming mode. During the fine programming mode, the voltage on the selected bit line is raised during a portion of the program voltage pulse, in one embodiment, to provide an inhibit voltage, e.g., between $t_1$ and $t_3$, which prevents programming of a selected storage element associated with the selected bit line. The inhibit voltage may be constant in this period, for instance. During a remainder of the program voltage pulse, the voltage on the selected bit line transitions to a lower level such as 0 V. The drain select gate voltage is reduced to 0 V and then returns to 2.5 V, between $t_2$ and $t_4$. As a result, the drain select gate transistor turns on and programming of the selected storage element on the selected string can begin. This transition occurs at $t_4$ in the example shown. In the time period between $t_1$ and $t_4$, the channel of the selected string maintains a boost voltage such as 7.5 V, similar to that of the channel of the unselected string, because the select gate of the selected string is closed. The select gate of the selected string is closed because the gate-to-source voltage of the drain select gate transistor is kept below the threshold voltage. When the voltage of the selected bit line transitions, e.g., drops, from the inhibit level, e.g., 2.5 V, to the program level, e.g., 0 V, at $t_3$, the voltage change is coupled from the selected bit line to one or more neighboring unselected bit lines due to the proximity of the bit lines. This coupling can cause a corresponding temporary change in the inhibit voltage that is provided on the unselected bit line or lines, as indicated by the dashed region generally between $t_3$ and $t_4$, if one or more neighboring bit lines are discharged. The drop in the inhibit voltage on the unselected bit line can be sufficient to discharge the boost voltage in the unselected string, resulting in program disturb.

As a solution to the bit line coupling, the drain select gate voltage can be adjusted according to the change in the selected bit line voltage. In particular, the drain select gate voltage can be temporarily reduced from its steady state level of 2.5 V to prevent select gate transistor turn on and boosted charge loss if a bit line is temporarily coupled low. Specifically, $V_{SGD}$ can be temporarily brought to 0 V just prior to the transition in the selected bit line voltage, e.g., at $t_2$, for a time period which is sufficient to allow the neighboring bit lines to recover from the coupling effect. $V_{SGD}$ can then be brought back to its steady state high level of 2.5 V, e.g., at $t_4$. The adjustment in $V_{SGD}$ prevents the bit line coupling from discharging the boosted voltage on the inhibited storage elements, thereby preventing program disturb. When $V_{SGD}$ returns to 2.5 V at $t_4$, the drain select gate transistor turns on and programming of the selected storage element on the selected string can begin. Also at $t_4$, the voltage in the selected NAND string, $V_{NAND}$, transitions from 7.5 V to 0 V. In another approach, $V_{SGD}$, $V_{bit\ line}$, unselected and $V_{bit\ line}$, selected, can be provided at a reduced level such as about 1.5 V instead of 2.5 V. This approach results in reduced power consumption, which has become an important issue for memory designs.

Figure 13:
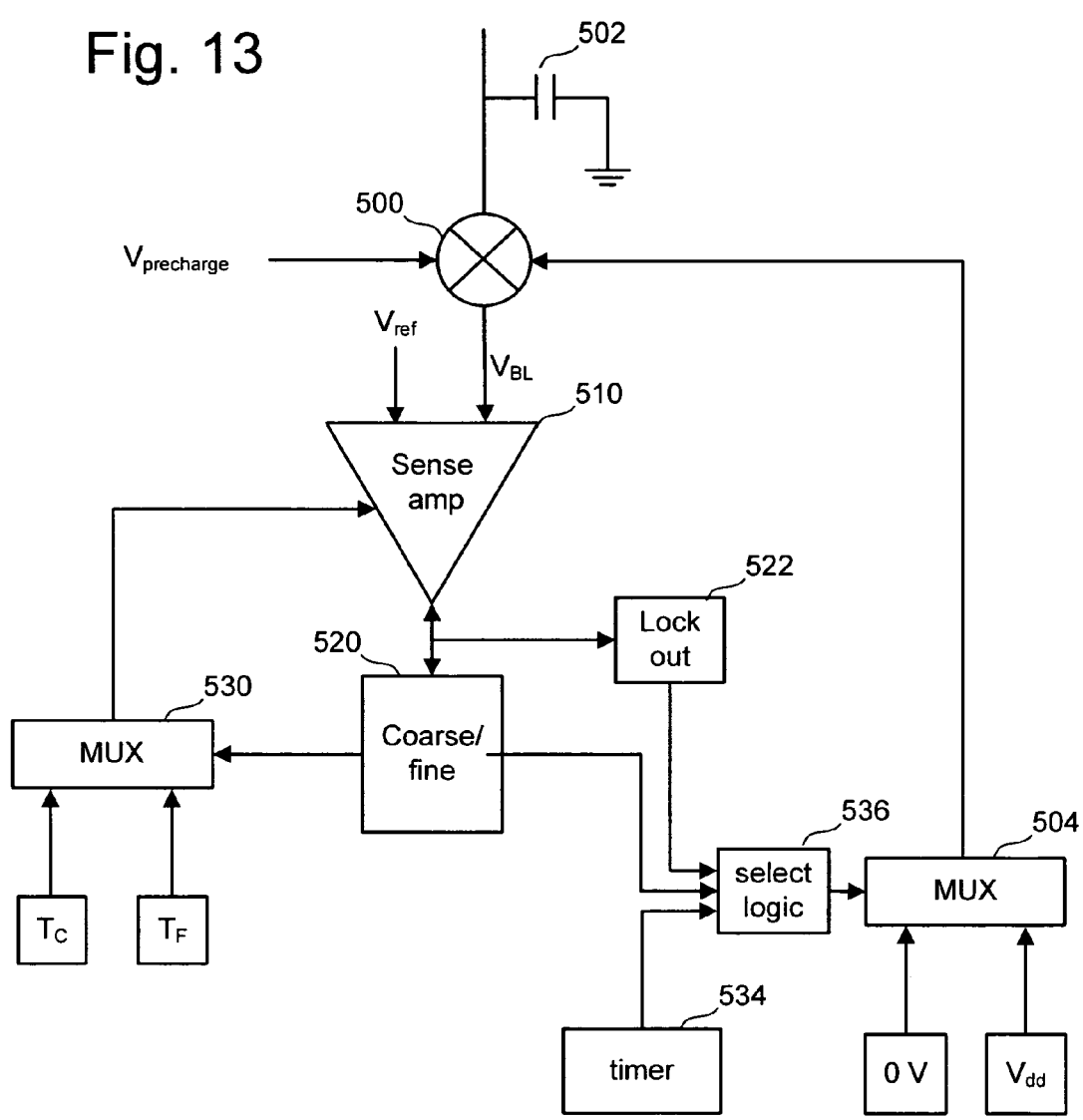
FIG. 13 is a block diagram of one embodiment of components used to verify and program a non-volatile storage element.

FIG. 13 is a block diagram of one embodiment of components used to verify and program a non-volatile storage element. A circuit for one bit line is shown. In one embodiment, there is one such circuit for each bit line. In another embodiment, there is such a circuit for a pair of bit lines (e.g., for each odd/even pair). The bit line is connected to switch 500 and a capacitor 502. The other terminal of the capacitor is connected to a reference potential such as ground. Note that the capacitance may come from the capacitance of the bit line itself. Switch 500 is connected to a pre-charge voltage ($V_{precharge}$) circuit and to an input of sense amplification circuit 510. The signal $V_{ref}$ is also connected to an input of sense amplification circuit 510. The output of sense amplification circuit 510 provides data to coarse/fine (C/F) register 520 and lockout register 522. The output of C/F register 520 provides data to multiplexers 530 and 504. Multiplexer 530 receives strobe signals $T_C$ and $T_F$, and chooses between the two signals based on the data from the coarse/fine register 520. The output of multiplexer 530 is connected to sense amplification circuit 510, thereby controlling the sensing related timing.

The verification operation of the components is based on a bit line discharge verification process. First, a bit line is pre-charged. Next, a verification pulse is provided to the control gate of the memory cell attached to that bit line. The bit line is then allowed to discharge. Based on the rate of discharge, it can be determined whether the storage element is above or below a particular threshold voltage level.

In another approach, logic can be implemented in firmware such as at the state machine 316 to carry out the desired functionality.

Figure 14:
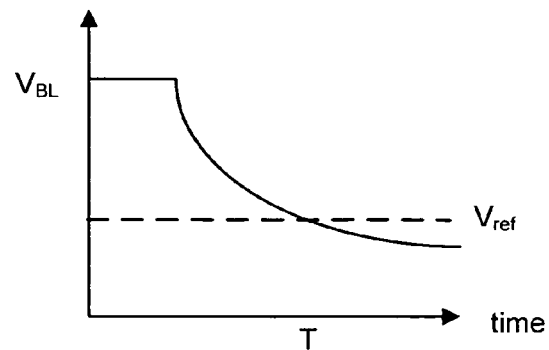
FIG. 14 is a graph of bit line voltage versus time for sensing.

FIG. 14 is a graph of bit line voltage versus time for sensing. In one implementation, starting from a precharge condition, the bit lines are allowed to discharge over a period of time T. At time T, the voltage of the bit line is compared against the reference voltage $V_{ref}$. If the bit line voltage $V_{BL}$ is greater than $V_{ref}$, then the storage element has a lower driving capability and is more programmed than the target threshold voltage. If at time T the bit line voltage is less than $V_{ref}$, then the threshold voltage of the storage element is less than the target threshold. For a storage element being programmed using the coarse/fine methodology, in one embodiment, the amount of time T can be changed so that there is one time, $T_C$, for discharge associated with coarse programming and another time, $T_F$, associated with discharging during the fine programming. In another embodiment, the compare point can be changed between coarse and fine by having one $V_{ref}$ for coarse programming and another $V_{ref}$ for fine programming.

In one embodiment of the apparatus depicted in FIG. 13, the coarse/fine register 520 is a 1-bit register (or latch) that indicates whether the particular storage element is in the coarse programming mode or in the fine programming mode. The value stored by the C/F register 520 is communicated to multiplexer 530. Sense amplifier 510 includes a circuit that compares the bit line voltage to the reference voltage $V_{ref}$ at the reference time strobe indicated by multiplexer 530. During programming, if the storage element is in the coarse programming mode, multiplexer 530 sends the coarse programming mode reference time strobe $T_C$ to sense amplifier 510. If, during coarse mode, sense amplifier 510 determines that the coarse verification process passed successfully because the bit line did not discharge to or below the fixed reference value $V_{ref}$ within the time indicated by $T_C$, then the sense amplifier 510 will cause the C/F register 520 to switch from a coarse state C to a fine state F. However, if the sense amplifier 510 further determines that the fine verification process also passed successfully because the bit line did not discharge to or below the fixed fine mode reference value within the time indicated by $T_F$, then the sense amplifier 510 will cause the lock out register 522 to indicate that the storage element should be locked out (inhibited) from further programming. Moreover, if the storage element is in the fine programming mode, multiplexer 530 will send the fine mode programming reference time strobe $T_F$ to sense amplifier 510. If, during the fine mode, sense amplifier 510 determines that the fine verification process passed successfully, because the bit line did not discharge to or below the fixed reference value $V_{ref}$ within the time indicated by $T_F$, then the sense amplifier 510 will cause lock out register 522 to indicate that the storage element should be locked out (inhibited) from further programming. Thus, after each program pulse, there are coarse and fine verify points. It is possible that a storage element will not pass either the coarse or fine verification on one pulse, but then pass both coarse and fine verifications on the next pulse. In this case, the storage element would transition directly from coarse programming to lock out. It is only if a storage element passes the coarse verification but fails the fine verification that it will transition to the fine programming mode on the next program pulse.

Switch 500 also receives an input from multiplexer 504. Multiplexer 504 has two inputs that can be selected: 0 V (allows programming) and $V_{dd}$ (inhibits programming). In other embodiments, different voltages can be used or more than two voltages can be used (e.g., using a multiplexer with more than two inputs). Multiplexer 504 is controlled by select logic circuit 536. Select logic circuit 536 receives data from C/F register 520, lockout register 522 and timer (or counter) 534. C/F register 520 indicates whether the storage element is in coarse or fine mode. Lockout register 522 indicates whether the storage element should be locked out (inhibited) from further programming. In one embodiment, timer 534 is a programmable timer that starts a timed count down at the beginning of a program pulse. Timer 534 is programmed to reach zero (and indicate so at its output) halfway through the program pulse. In other embodiments, the timer can report at times other than halfway through the pulse.

Select logic circuit 536 will cause multiplexer 504 to apply $V_{dd}$ to the bit line when the storage element is to be locked out from programming. Select logic circuit 536 causes multiplexer 504 to apply 0 V to the bit line when the storage element is being programmed in the coarse mode. Select logic circuit 536 initially causes multiplexer 504 to apply $V_{dd}$ to the bit line when the storage element is being programmed in the fine mode. Select logic circuit 536 causes the bit line voltage to change by changing the selection sent to multiplexer 504 (as governed by timer 534) so that the output of multiplexer 504 changes from $V_{dd}$ to 0 V part of the way (e.g., halfway) through the program pulse.

Figure 15:
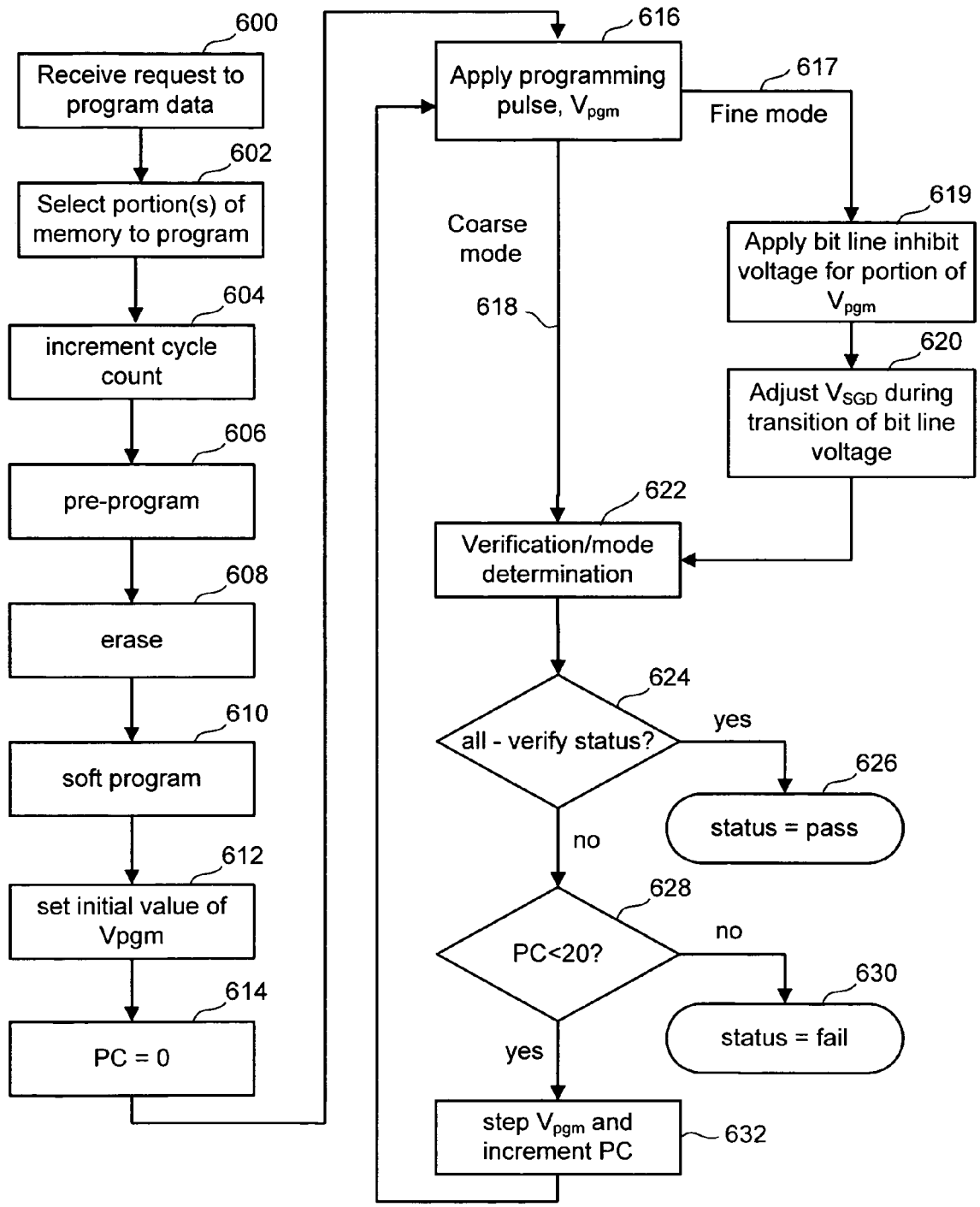
FIG. 15 is a flow chart describing one embodiment of a process for programming flash memory.

FIG. 15 provides a flow chart describing a process for programming non-volatile storage. The process can be initiated in response to receiving a request to program data, as indicated at step 600. At step 602, the system selects the appropriate portions of memory to program. At step 604, the cycle count is incremented. The cycle count, which is a count of the number of programming cycles, can be stored in the flash memory array, the state machine, the controller, or another location. In one embodiment, the cycle count is stored in a register associated with the state machine. At step 606, the selected portion of memory is optionally pre-programmed, which provides for even wearing of the flash memory. All storage elements in the chosen sector or page are programmed to the same threshold voltage range. At step 608, all the storage elements to be programmed are then erased. For example, step 608 can include moving all storage elements to the erased state E. At step 610, a soft programming process addresses the issue that, during the erase process, it is possible that some of the storage elements have their threshold voltages lowered to a value that is below the erased distribution. The soft programming process applies program voltage pulses to the storage elements so that their threshold voltages will increase to be within threshold voltage distribution E. In step 612, the magnitude of the initial program pulse is set, e.g., by properly programming the charge pump. At step 614, the program count PC is initially set to zero.

At step 616, a program pulse $V_{pgm}$ is applied to the appropriate word line(s). Generally, many storage/memory elements can be programmed in parallel. In one approach, the different memory elements can be in a coarse or fine programming mode, or a lockout mode. The same programming pulse thus is applied to each memory element on the one or more selected word lines. For memory elements in the coarse mode, processing proceeds on a path block 618. For these elements, the associated bit line voltage remains at 0 V throughout the pulse. For memory elements in the fine mode, processing proceeds on a path 617. At step 619, a bit line inhibit voltage is applied to the associated bit lines for a portion of the programming pulse, and, at step 620, the select gate voltage $V_{SGD}$ is adjusted during a transition of the bit line inhibit voltage, e.g., from the inhibit level ($V_{dd}$) to 0 V, as described previously. Processing of the locked out memory elements is not shown as no programming is performed. In this case, an inhibit voltage is applied to the associated bit lines for the duration of the programming pulse.

In step 622, the memory elements on the selected word line(s) are verified to see if they have reached the target threshold voltage level, and to further perform a mode determination to determine if the memory elements have transitioned to a new mode, e.g., from the coarse mode to the fine mode, from the fine mode to the lockout mode, or from the coarse mode to the lockout mode. If all the memory elements have reached the target threshold voltage level (step 624), then the programming process has completed successfully (status=pass) in step 626. If not all the memory elements have been verified, then it is determined in step 628 whether the program count PC is less than a limit such as twenty. If the program count is not less than the limit, then the programming process has failed (step 630). If the program count is less than the limit, then in step 632, the magnitude of program voltage signal $V_{pgm}$ is incremented by the step size (e.g., 0.3 V) for the next pulse and the program count PC is incremented. Note that those memory elements that have reached their target threshold voltage are locked out of programming for the remainder of the current programming cycle. After step 632, the process continues at step 616 and the next program pulse is applied. The process is repeated until a pass or fail status has been declared for each of the memory elements.

Figure 16:
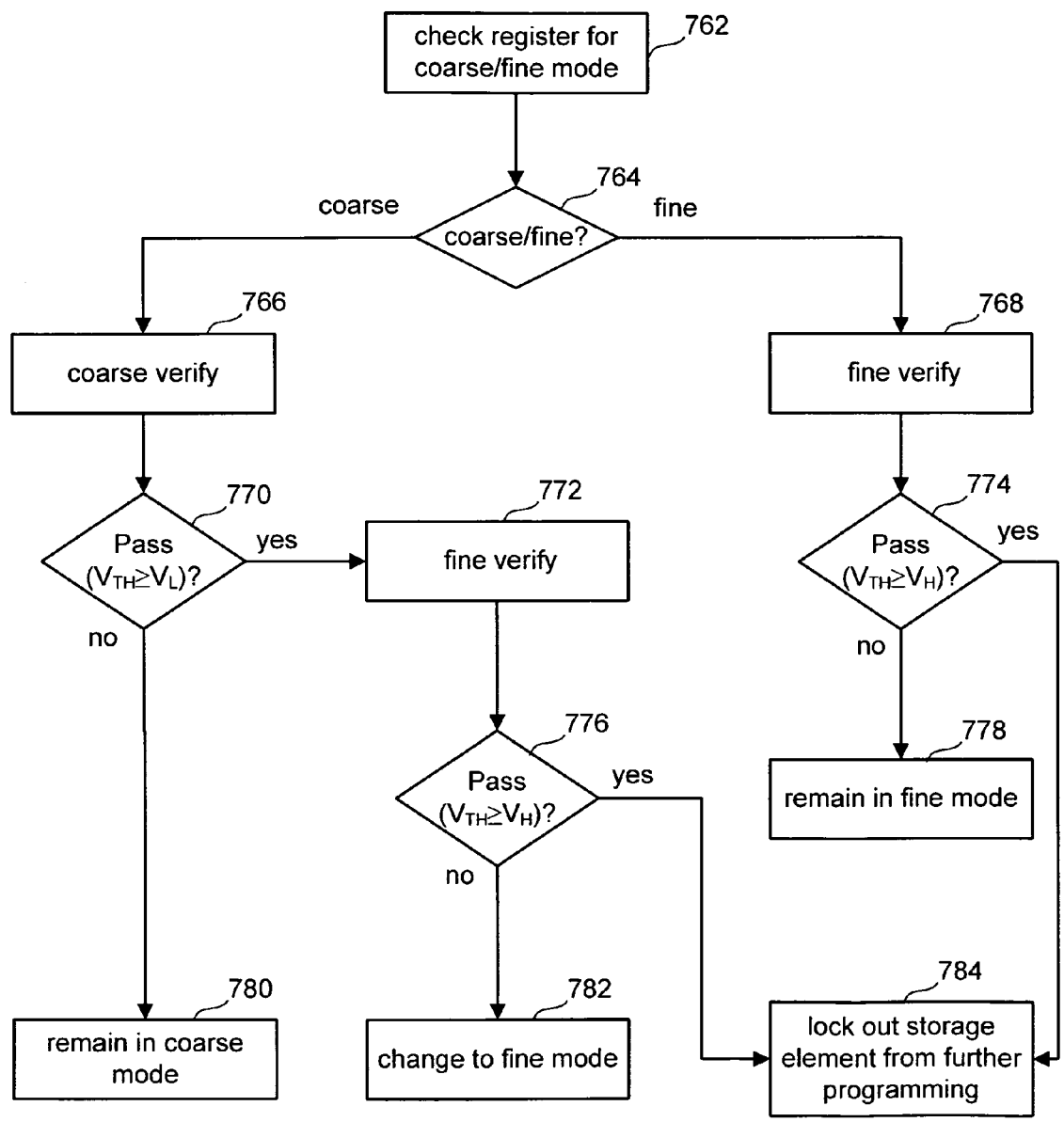
FIG. 16 is a flow chart describing one embodiment of a process for performing verification and coarse/fine mode determination.

FIG. 16 is a flow chart describing one embodiment of a process for performing verification and coarse/fine mode determination. The process corresponds generally to step 622 of FIG. 15. In step 762, a register (or other storage device) is checked to determine whether the particular storage element being programmed is in the coarse or the fine programming mode. If the storage element is in the coarse mode (decision block 764), then a coarse verification is performed in step 766. For example, referring to FIG. 7, for a storage element which is to be programmed to state A, the current threshold voltage $V_{TH}$ of the storage element can be compared to the lower threshold voltage $V_L$. Note that, in many embodiments, there are lower and higher voltage thresholds, $V_L$ and $V_H$, for each threshold voltage distribution to which a storage element can be programmed. If the threshold voltage of the storage element is at or above $V_H$ for the target state, e.g., $V_{TH} \geq V_L$ (decision block 770), then the storage element has passed the coarse verification test, and a subsequent test is performed to determine if the storage element can also pass the fine verification test at step 772. For example, the threshold voltage $V_{TH}$ of the storage element to be programmed to state A can be compared to the higher threshold voltage $V_H$. If $V_{TH} \geq V_H$, at decision block 776, then the storage element has also passed the fine verification test, and the storage element will be inhibited/locked out from further programming (step 784) during the current programming cycle or session, e.g., by raising the bit line to $V_{dd}$ during the programming operation. Other means for inhibiting or locking out a storage element can also be used. If the decision block 776 is false, then the storage element has not passed the fine verification test, and instead enters the fine programming mode (step 782). If the decision block 770 is false, then the storage element has not passed the coarse verification test, and therefore remains in the coarse programming mode (step 780).

If, in decision block 764, the storage element is in the fine programming mode, then a fine verification process is performed in step 768. If $V_{TH} \geq V_H$ at decision block 774, then the fine verification test has been passed and the storage element will be inhibited/locked out from further programming (step 784) during the current programming cycle or session. If the decision block 774 is false then the storage element will not be inhibited/locked out from further programming and will remain in the fine programming mode (step 778).

The process described can be performed on an individual storage element. However, in many embodiments, multiple storage elements are programmed concurrently. Thus, the process described can be performed on multiple storage elements concurrently as well. During such programming, some of the storage elements will be in the coarse programming mode, fine programming mode, or inhibited/locked out from programming.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method for programming non-volatile storage, comprising:

applying a program voltage to at least first and second non-volatile storage elements in a set of non-volatile storage elements, the first and second non-volatile storage elements being coupled to respective first and second bit lines via respective first and second select gates;

partially inhibiting programming of the first non-volatile storage element during the program voltage by controlling a voltage applied to the first bit line;

inhibiting programming of the second non-volatile storage element during the program voltage by providing an inhibit voltage on the second bit line; and adjusting a select gate voltage which is applied to the second select gate during a transition in the voltage applied to the first bit line during the program voltage.

2. The method of claim 1, wherein the transition comprises a voltage drop which causes a drop in the inhibit voltage provided on the second bit line due to coupling between the first and second bit lines.

3. The method of claim 2, wherein the voltage drop would be sufficient to cause the second select gate to turn on if the select gate voltage were not adjusted in the adjusting step.

4. The method of claim 1, wherein the transition comprises a reduction from a first voltage level which inhibits programming of the first non-volatile storage element, to a second voltage level which allows programming of the first non-volatile storage element.

5. The method of claim 1, wherein the adjusting comprises temporarily reducing the select gate voltage.

6. The method of claim 1, wherein the select gate voltage is also applied to the first select gate.

7. The method of claim 6, wherein the adjusting comprises temporarily reducing the select gate voltage from a steady state level which is sufficiently low relative to the inhibit voltage provided on the second bit line to maintain the second select gate closed, and sufficiently high relative to the voltage applied to the first bit line, during at least a portion of the program voltage, to maintain the first select gate open.

8. The method of claim 1, wherein the program voltage comprises a voltage pulse in a series of voltage pulses.

9. The method of claim 1, wherein the transition comprises a reduction from a first voltage level which inhibits programming of the first non-volatile storage element, during a first portion of the program voltage, to a second level which allows programming of the first non-volatile storage element, during a second portion of the program voltage.

10. The method of claim 1, wherein the first and second non-volatile storage elements are arranged in respective NAND strings.

11. The method of claim 1, wherein the program voltage is applied to the first and second non-volatile storage elements via a common word line.

12. A method for programming non-volatile storage, comprising:
controlling a rate of programming of a first non-volatile storage element, in a set of non-volatile storage elements, by controlling a voltage applied to a first bit line to which the first non-volatile storage element is coupled via a first select gate;
inhibiting programming of a second non-volatile storage element, in the set of non-volatile storage elements, by providing an inhibit voltage on a second bit line to which the second non-volatile storage element is coupled via a second select gate; and
adjusting a select gate voltage applied to the second select gate in accordance with a change in the voltage applied to the first bit line.

13. The method of claim 12, wherein the change comprises a change from a first voltage level which inhibits programming of the first non-volatile storage element, to a second voltage level which allows programming of the first non-volatile storage element.

14. The method of claim 12, wherein the adjusting comprising temporarily changing the select gate voltage from a steady state level.

15. The method of claim 12, wherein the first and second non-volatile storage elements are arranged in respective NAND strings.

16. The method of claim 12, wherein the adjusting of the select gate voltage compensates for a change in the inhibit voltage on the second bit line which is caused, through coupling, by the change in the voltage applied to the first bit line, thereby maintaining the second select gate closed during the coupling.

17. The method of claim 12, wherein the change comprises a change from a first voltage level which inhibits programming of the first non-volatile storage element, during a first portion of a program voltage applied thereto, to a second voltage level which allows programming of the first non-volatile storage element, during a second portion of the program voltage.

18. The method of claim 17, wherein the program voltage is applied to the first and second non-volatile storage elements via a common word line.

19. The method of claim 17, wherein the program voltage comprises a voltage pulse in a series of voltage pulses.

20. The method of claim 12, wherein the select gate voltage is also applied to the first select gate.

21. A method for programming non-volatile storage, comprising:
applying a program voltage to at least first and second non-volatile storage elements in a set of non-volatile storage elements, the first and second non-volatile storage elements being coupled to respective first and second bit lines via respective first and second select gates;
applying a voltage to the first bit line;
applying a select gate voltage to the second select gate; and
adjusting the select gate voltage in accordance with a change in the voltage applied to the first bit line to maintain the second select gate closed.

22. The method of claim 21, wherein the change comprises a change from a first voltage level which inhibits programming of the first non-volatile storage element, to a second voltage level which allows programming of the first non-volatile storage element.

23. The method of claim 21, wherein the adjusting comprises temporarily changing the select gate voltage from a steady state level.

24. The method of claim 21, wherein the change comprises a change from a first voltage level which inhibits programming of the first non-volatile storage element, during a first portion of the program voltage, to a second voltage level which allows programming of the first non-volatile storage element, during a second portion of the program voltage.

25. The method of claim 21, wherein the program voltage is applied to the first and second non-volatile storage elements via a common word line.

26. The method of claim 21, wherein the first and second non-volatile storage elements are arranged in respective NAND strings.

27. The method of claim 21, wherein the program voltage comprises a voltage pulse in a series of voltage pulses.

28. The method of claim 21, wherein the adjusting of the select gate voltage compensates for a change in a voltage on the second bit line which is caused, through coupling, by the change in the voltage applied to the first bit line.

* * * * *